United States Patent [19]
Satoh et al.

[11] Patent Number: 5,821,016
[45] Date of Patent: Oct. 13, 1998

[54] COLORED IMAGE FORMING MATERIAL AND COLOR FILTER OBTAINED THEREFROM

[75] Inventors: Tsutomu Satoh, Kashiwa; Shigeo Tachiki, Hitachi; Yuji Kobayashi, Hitachi; Toshihiko Akahori, Hitachi; Syoichi Sasaki, Hitachi; Kouji Yamazaki; Yoichi Kimura, both of Ichihara, all of Japan

[73] Assignee: Hitachi Chemical Company, Ltd., Tokyo, Japan

[21] Appl. No.: 672,720

[22] Filed: Jun. 28, 1996

[30] Foreign Application Priority Data

Jun. 29, 1995 [JP] Japan ................................ 7-163952

[51] Int. Cl.$^6$ ............................ G02B 5/20; G02F 1/1335; G03F 7/038
[52] U.S. Cl. ........................... 430/7; 430/287.1; 430/293; 430/294
[58] Field of Search ............................ 430/7, 287.1, 293, 430/294; 522/71

[56] References Cited

FOREIGN PATENT DOCUMENTS

| 0287019 | 10/1988 | European Pat. Off. . |
|---|---|---|
| 4-164901 | 6/1992 | Japan . |
| 5-265208 | 10/1993 | Japan . |
| 2257711 | 1/1993 | United Kingdom . |

*Primary Examiner*—John A. McPherson
*Attorney, Agent, or Firm*—Antonelli, Terry, Stout & Kraus, LLP

[57] ABSTRACT

In a colored image forming material comprising (a) a copolymer containing a carboxyl group, (b) a coloring agent, (c) a monomer containing at least one photopolymerizable unsaturated bond in the molecule, (d) a photoinitiator and, when required, (e) a specific sensitizer, the dispersion stability of pigment and the optical sensitivity can be considerably increased by using a specific copolymer of styrene derivative-maleic acid derivative as component (a) and specific benzoimidazole or benzothiazole as component (e), and a photosensitive element or a color filter with distinguished optical characteristics can be obtained therefrom.

22 Claims, 1 Drawing Sheet

COLORED IMAGE FORMING MATERIAL AND COLOR FILTER OBTAINED THEREFROM

BACKGROUND OF THE INVENTION

The present invention relates to a colored image forming material, and a photosensitive solution, a photosensitive element, a process for producing a color filter and a color filter, using the same.

Recently, color filters are widely used in liquid crystal display devices, sensors, calorimetric devices, etc. These color filters have been produced by patterning a dyeable resin such as natural gelatin or casein and dyeing the patterned resin mainly with a dye to give picture cells (JP-B 52-17375, JP-B 52-173765, etc.). However, the thus obtained picture cells have such problems as low heat resistance and low light resistance due to the nature of the resin and dye used.

In order to improve the heat resistance and light resistance, a process using a photosensitive material containing a pigment dispersed therein is recently attracting a keen attention and is now under-going close study from various aspects (JP-A 1-152449, JP-A 1-254918, etc.). It is known that the process can simplify the production steps and also can give stable color filters with a long life. However, the process still has such problems as difficulty in achieving stable dispersion of pigment, particularly selection of a dispersing resin having an important effect on the dispersibility of the pigment, and also difficulty in enhancing the photosensitivity of a film containing much pigment. That is, now available films have a low photosensitivity.

SUMMARY OF THE INVENTION

An object of the present invention is to provide a colored image forming material having considerably improved dispersion stability of pigment and photosensitivity, being free from the problems of pigment-dispersed photosensitive materials so far encountered, and also to provide a photosensitive solution containing the colored image forming material, a photosensitive element comprising a support and a layer prepared from the photosensitive solution, and a process for producing a color filter and a color filter, using the colored image forming material.

According to a first aspect of the present invention, there is provided a colored image forming material (A), which comprises:

(a) a resin having an acid value of 20 to 300 and an unsaturation equivalent weight of 200 to 3,000 represented by the following formula (I):

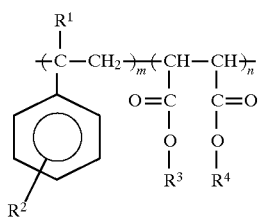

wherein $R^1$ is a hydrogen atom or a methyl group; $R^2$ is a hydrogen atom, a hydroxyl group or an alkyl group or an alkoxy group having 1 to 12 carbon atoms; $R^3$ and $R^4$ are independently at least one of a hydrogen atom, an alkyl group having 1 to 12 carbon atoms and a group having a photopolymerizable unsaturated bond, which may have one hydroxyl group, with the proviso that at least some of the groups represented by $R^3$ and $R^4$ are hydrogen to provide the needed acid value and at least some of these groups are the group having a photopolymerizable unsaturated bond to provide the needed unsaturation equivalent weight; and m and n are independently an integer of 1 or more and are so selected as to satisfy a relationship of m>n, (b) a coloring agent,
(c) a monomer having at least one photopolymerizable unsaturated bond in the molecule, and
(d) a photoinitiator.

According to a second aspect of the present invention, there is provided a colored image forming material (B), which comprises:

(a') a copolymer having a carboxyl group,
(b) a coloring agent,
(c) a monomer having at least one photopolymerizable unsaturated bond in the molecule, when required,
(d) a photoinitiator, and
(e) a compound represented by the following formula (II) or (III):

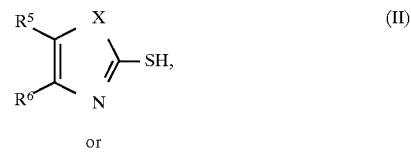

or

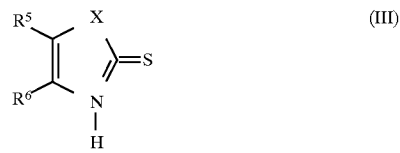

wherein X is a sulfur atom, an oxygen atom, or N—$R^7$, where $R^7$ is a hydrogen atom or an alkyl group having 1 to 5 carbon atoms; $R^5$ and $R^6$ each are a hydrogen atom, an alkyl group having 1 to 5 carbon atoms, a hydroxyalkyl group having 1 to 3 carbon atoms, a phenyl group which may have an alkoxy group having 1 to 8 carbon atoms as a substituent, a nitro group, an alkoxycarbonyl group having an alkyl group of 1 to 8carbon atoms, a phenoxycarbonyl group, an acetyl group or a carboxyl group, or $R^5$ and $R^6$ may be combined together to form a benzene ring, or the double bonds between $R^5$ and $R^6$ may be hydrogenated.

According to a third aspect of the present invention, there is provided a photosensitive solution, which comprises the colored image forming material (A) or (B) and a solvent.

According to a fourth aspect of the present invention there is provided a photosensitive element, which comprises a support and a film of the colored image forming material (A) or (B).

According to a fifth aspect of the present invention, there is provided a process for producing a color filter, which comprises forming a film of the colored image forming material on a substrate, exposing the film to actinic light imagewise, thereby photo-curing the desired portions of the film, removing the unexposed portions from the film by development, and if necessary repeating the above-mentioned steps for individual different colored image forming materials, respectively, thereby forming a plurality of different colored picture cells.

According to a sixth aspect of the present invention, there is provided a color filter produced according the above-mentioned process.

PREFERRED EMBODIMENTS OF THE INVENTION

Figure 1:
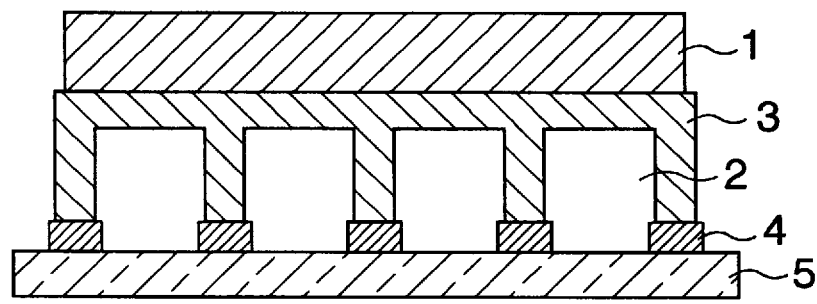
FIG. 1 is a cross-sectional view of a color filter according to the present invention.

As a result of extensive studies, the present inventors have found that the dispersion stability of pigment and photosensitivity can be considerably enhanced with a specific resin, and have established the present invention.

The present invention provides a colored image forming material (A), which comprises:

(a) a resin having an acid value of 20 to 300 and an unsaturation equivalent weight of 200 to 3,000, preferably 600 to 3,000, represented by the following formula (I):

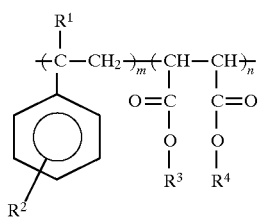

wherein $R^1$ is a hydrogen atom or a methyl group; $R^2$ is a hydrogen atom, a hydroxyl group or an alkyl group or an alkoxy group having 1 to 12 carbon atoms; $R^3$ and $R^4$ are independently at least one of hydrogen atom, an alkyl group having 1 to 12 carbon atoms and a group having a photopolymerizable unsaturated bond, which may have one hydroxyl group, with the proviso that at least some of the groups represented by $R^3$ and $R^4$ are hydrogen to provide the needed acid value and at least some of these groups are the group having a photopolymerizable unsaturated bond to provide the needed unsaturation equivalent weight; and m and n are independently an integer of 1 or more and are so selected as to satisfy a relationship of m>n, (b) a coloring agent, (c) a monomer having at least one polymerizable unsaturated bond in the molecule, and (d) a photoinitiator; and the invention further provides a photosensitive solution (A'), which comprises the colored image forming material (A) and a solvent, preferably diethyleneglycol mono- or dialkyl ether, mono- or di-alkyl ether of propylene glycol, mono- or di-alkyl ether of dipropylene glycol, mono- or di-alkyl ether of tripropylene glycol, acetylation product of diethyleneglycol monoalkyl ether or lactone, and a photosensitive element, which comprises a support film and a layer of the colored image forming material (A).

Furthermore, the present invention provides a process for producing a color filter, which comprises forming a film of the colored image forming material on a substrate, exposing the film to actinic light image-wise, thereby photocuring the exposed portions of the film, removing the unexposed portions from the film by development, and if necessary repeating the above-mentioned steps for individual different colored imaging materials, respectively, thereby forming a plurality of different colored picture cells; and further provides a color filter produced according to the above-mentioned process.

The present invention will be described in detail below:

The resin having an acid value of 20 to 300 and an unsaturation equivalent weight of 200 to 3,000 preferably 600 to 3,000, for use in the present invention as component (a) is represented by the following formula (I):

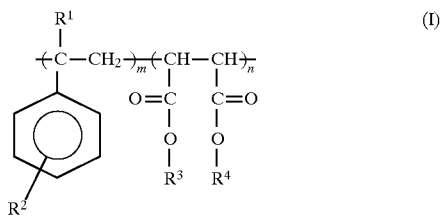

wherein $R^1$ is a hydrogen atom or a methyl group; $R^2$ is a hydrogen atom, a hydroxyl group or an alkyl group or an alkoxy group having 1 to 12 carbon atoms; $R^3$ and $R^4$ are independently at least one of hydrogen atom, an alkyl group having 1 to 12 carbon atoms and a group having a photopolymerizable unsaturated bond, which may have one hydroxyl group, with the proviso that at least some of the groups represented by $R^3$ and $R^4$ are hydrogen to provide the needed acid value and at least some of these groups are the group having a photopolymerizable unsaturated bond to provide the needed unsaturation equivalent weight; and m and n are independently an integer of 1 or more and are so selected as to satisfy a relationship of m>n.

In the formula (I), the structure means not only a block copolymer but also a random copolymer of the two units. Further, plural $R^1$, $R^2$, $R^3$ or $R^4$ may be two or more different groups.

Particularly, $R^3$ or $R^4$ has to include a hydrogen atom and a group having a photopolymerizable unsaturated bond to provide the acid value and the unsaturation equivalent weight described above.

It is a preferable embodiment that $R^3$ is an alkyl group having 1 to 12 carbon atoms; $R^4$ is a hydrogen atom, an alkyl group having 1 to 12 carbon atoms or a group having a photopolymerizable unsaturated bond, which may have one hydroxyl group; and m and n are so selected as to satisfy a relationship of $1 \leq m/n \leq 5$, because the dispersing property for a coloring agent, the latitude for developing conditions, the mechanical property after curing and the adhering strength with a substrate are improved.

Preferable basic skeleton of the resin (a) is copolymers of styrene or its derivatives with monoalkyl maleate ester. Use of maleic acid or maleic anhydride in place of monoalkyl maleate ester is not preferable because of lower copolymer yield. More specifically, the basic structure of the resin (a) includes copolymers of styrene or its derivatives such as α-methylstyrene, m- or p-methoxystyrene, p-hydroxystyrene, 2-methoxy-4-hydroxystyrene, 2-hydroxy-4-methylstyrene, etc., with monoalkyl maleate esters such as monomethyl maleate, monoethyl maleate, mono-n-propyl maleate, monoisopropyl maleate, mono-n-butyl maleate, mono-n-hexyl maleate, mono-n-octyl maleate, mono-2-ethylhexyl maleate, mono-n-nonyl maleate, mono-n-dodecyl maleate, etc., where a ratio of styrene or its derivatives to monoalkyl maleate ester, m/n, must be 1or more, preferably in a range of 1/1 to 5/1.

It is essential that the resin (a) for use in the present invention has a photopolymerizable unsaturated bond for improving the photosensitivity and a carboxyl group for ensuring the alkali development.

The photopolymerizable unsaturated bond can be introduced into the resin by subjecting the copolymers of styrene or its derivatives with monoalkyl maleate ester to partial esterification with an unsaturated alcohol such as allyl alcohol, 2-butene-4-ol, furfuryl alcohol, oleyl alcohol, cinnamyl alcohol, 2-hydroxyacrylate, 2-hydroxymethacrylate, N-methylolacrylamide, etc., or to an addition reaction with a compound having an oxysilane ring and an ethylenic unsaturated bond such as glycidyl methacrylate, glycidyl acrylate, allylglycidyl ether, α-ethylglycidyl acrylate, crotonylglycidyl ether, monoalkylmonoglycidyl itaconate ester, etc.

Copolymerization of styrene or its derivatives with maleic acid or maleic anhydride monoesterified with the above-mentioned unsaturated alcohol or subjected to addition reaction with the above-mentioned compound having an oxysilane ring and an ethylenic unsaturated bond in advance is not acceptable, because the unsaturated bond undergoes reaction during the copolymerization, resulting in high gelation possibility.

The unsaturation equivalent weight of the resin (a) must be 200 to 3,000, preferably 600 to 3,000, more preferably 800 to 2,000. Below 200, there is a possibility of partial curing when dispersed together with a coloring agent, which will be described later, whereas above 3,000 the effect on the photosensitivity improvement is lowered. The term "unsaturation equivalent weight", as herein referred to, means a molecular weight of the resin per unsaturated bonds remaining in the resin.

Furthermore, the resin for use in the present invention as component (a) must have remaining carboxyl groups therein, and thus its acid value must be 20 to 300, preferably 40 to 200, more preferably 60 to 150. Below 20, the alkali developability is lowered, whereas above 300 the shape of image pattern becomes unclear.

The unsaturation equivalent weight and the acid value of the resin (a) can be provided by controlling amounts of the monoalkyl maleate ester and the unsaturated alcohol mentioned above.

The weight average molecular weight of the resin as component (a) is preferably in a range of 1,500–100,000, more preferably 1,500 to 30,000, most preferably 4,000 to 15,000. Below 1,500 the dispersion stability of the coloring agent is liable to decrease, whereas above 30,000 the viscosity of photosensitive solution containing the colored image forming material is liable to increase and its spin coatability is liable to decrease. The weight average molecular weight is measured by gel permeation chromatography (GPC) using a polystyrene as a standard.

Preferably 10 to 85% by weight, more preferably 20 to 60% by weight, most preferably 25 to 50% by weight, of the resin as component (a) is used on the basis of sum total of components, (a), (b), (c) and (d). Below 10% by weight the dispersion stability of the coloring agent is liable to decrease, whereas above 85% by weight the viscosity of photosensitive solution containing the colored image forming material is liable to increase and its spin coatability is liable to decrease.

The coloring agent for use in the present invention as component (b) will be described below:

Any one of dyes and pigments can be used as a coloring agent in the present invention. From a viewpoint of heat resistance and light resistance, pigments are preferable. Pigments include inorganic pigments and organic pigments. From a viewpoint of abundance of color tones, etc., carbon black (inorganic pigment) and organic pigments are usually preferable. organic pigments for use in the present invention include, for example, azo series, phthalocyanine series, indigo series, anthraquinone series, perylene series, quinacridone series, methine-azomethine series, and isoindolinone series.

When the colored image forming material is applied to a color filter, individual pigment series suitable for colored images such as red, green, blue and black images are used.

For the red colored image, a single red pigment series can be used, or a mixture of red pigment series and yellow pigment series, toned with the latter, can be also used. Red pigment series for use in the present invention includes, for example, C.I. Pigment Red 9, 123, 155, 168, 177, 180, 217, 220, 224, etc. Yellow pigment series for use in the present invention includes, for example, C.I. Pigment Yellow 20, 24, 83, 93, 109, 110, 117, 125, 139, 147, 154, etc. At least one each of these red pigments and yellow pigments can be used as a mixture. In case of a mixture of red pigment series and yellow pigment series, preferably not more than 50 parts by weight of yellow pigment series is used on the basis of 100 parts by weight of sum total of the red pigment series and the yellow pigment series.

For the green colored image, a single green pigment series can be used, or a mixture of green pigment series and the above-mentioned yellow pigment series, toned with the latter, can be also used. The green pigment series for use in the present invention includes, for example, C.I. Pigment Green 7, 36, 37, etc. At least one each of these green pigments and yellow pigments can be used as a mixture. In case of a mixture of green pigment series and yellow pigment series, preferably not more than 50 parts by weight of yellow pigment series is used on the basis of 100 parts by weight of sum total of the green pigment series and the yellow pigment series.

For the blue colored image, a single blue pigment series can be used, or a mixture of blue pigment series and violet pigment series, toned with the latter, can be used. The blue pigment series for use in the present invention includes, for example, C.I. Pigment Blue 15, 15:3, 15:4, 15:6, 22, 60, etc. The violet pigment series for use in the present invention includes, for example, C.I. 19, 23, 29, 37, 50, etc. At least one each of these blue pigments and violet pigments can be used as a mixture. In case of a mixture of blue pigment series and violet pigment series, preferably 50 parts by weight of the violet pigment series is used on the basis of 100 parts by weight of sum total of the blue pigment series and the violet pigment series.

For the black colored image, such black pigments as carbon black, titanium carbon, black iron oxide, manganese dioxide, etc. can be used.

Preferably 5 to 50% by weight, more preferably 10 to 40% by weight, most preferably 15 to 30% by weight, of the coloring agent as component (b) is used on the basis of sum total of components (a), (b), (c) and (d) in the present invention. Below 5% by weight, the color density of the image is liable to decrease, whereas above 50% by weight the photosensitivity is liable to decrease.

The monomer having at least one photopolymerizable unsaturated bond in the molecule for use in the present invention as component (c) includes, for example, methyl methacrylate, benzyl methacrylate, butoxyethyl methacrylate, butoxyethyl methacrylate, butoxytriethylene glycol acrylate, ECH-modified butyl acrylate (where ECH is an abbreviation for "epichloro-hydrin" and will be hereinafter used), dicyclopentanyl acrylate, EO-modified dicyclopentenyl acrylate (where EO is an abbreviation for "ethylene oxide", which will be hereinafter used), N,N-dimethylaminoethyl methacrylate, ethyldiethylene glycol acrylate, 2-ethylhexyl acrylate, glycerol methacrylate, heptadecafluorodecyl acrylate, 2-hydroxyethyl methacrylate, caprolactone-modified-2-hydroxyethyl acrylate, isobornyl acrylate, methoxydipropylene glycol acrylate, methoxylated cyclodecatriene acrylate, phenoxyhexaethylene glycol acrylate, EO-modified phosphoric acrylate, caprolactone-modified tetrahydrofurfuryl acrylate, EO-modified bisphenol A diacrylate, ECH-modified bisphenol A diacrylate, bisphenol A dimethacrylate, 1,4-butanediol diacrylate, 1,3-butylene glycol diacrylate, diethylene glycol dimethacrylate, glycerol dimethacrylate, neopentyl glycol diacrylate, EO-modified phosphoric diacrylate, ECH-modified phthalic diacrylate, polyethylene glycol 400 diacrylate, polypropylene glycol 400 dimethacrylate, tetraethylene glycol diacrylate, ECH-modified 1,6-hexanediol diacrylate, trimethylolpropane triacrylate, pentaerythritol triacrylate, EO-modified phosphoric triacrylate, EO-modified trimethylolpropane triacrylate, PO-modified trimethylolpropane triacrylate (where PO is an abbreviation for "propylene oxide" and will be hereinafter used), tris(methacryloxyethyl) isocyanurate, pentaerythritol tetraacrylate, dipentaerythritol tetracrylate, dipentaerythritol hexacrylate, dipentaerythritol pentacrylate, etc. These monomers can be used alone or in a mixture of at least two thereof.

Preferably 2 to 50% by weight, more preferably 5 to 40% by weight, most preferably 10 to 30% by weight, of the monomer as component (c) is used on the basis of sum total of components (a), (b), (c) and (d) in the present invention. Below 2% by weight, the photosensitivity is liable to decrease, whereas above 50% by weight the dispersion stability of the coloring agent as component (b) is liable to decrease.

The photoinitiator as component (d) for use in the present invention includes, for example, benzophenone, N,N'-tetraethyl-4,4'-diaminobenzophenone, 4-methoxy-4'-dimethylaminobenzophenone, benzyl, 2,2-diethoxyacetophenone, benzoin, benzoin methyl ether, benzoin isobutyl ether, benzyl dimethyl ketal, α-hydroxyisobutylphenone, thioxanthone, 2-chlorothioxanthone, 1-hydroxycyclohexylphenyl ketone, 2-methyl-1-[4-(methylthio)phenyl]-2-morpholino-1-propane, t-butylanthraquinone, 1-chloroanthraquinone, 2,3-dichloroanthraquinone, 3-chloro-2-methylanthraquinone, 2-ethylanthraquinone, 1,4-naphthoquinone, 9,10-phenanthraquinone, 1,2-benzanthraquinone, 1,4-dimethylanthraquinone, 2-phenylanthraquinone, 2-(o-chlorophenyl)-4,5-diphenylimidazole dimer, etc. These photoinitiators can be used alone or in a mixture of at least two thereof.

Preferably 0.01 to 20% by weight, more preferably 2 to 15% by weight, most preferably 5 to 10% by weight, of the photoinitiator as component (d) is used on the basis of sum total of components (a), (b), (c) and (d). Below 0.01% by weight, the photosensitivity is liable to decrease, whereas above 20% by weight the adhesiveness is liable to decrease.

Besides the essential components (a), (b), (c) and (d), the present colored image forming material (A) may further contain, if necessary, additives, for example, a thermal polymerization inhibitor for suppressing dark reaction such as hydroquinone, hydroquinone monomethyl ether, pyrogallol, t-butyl catechol, etc.; a silane coupling agent having a vinyl group, an epoxy group, an amino group, a mercapto group, etc. or a titanate coupling agent for improving adhesiveness to the substrate, such as isopropyltrimethacryloyl titanate, diisopropylisostearoyl-4-aminobenzoyl titanate, etc.; a surfactant for improving smoothness of film such as fluorine series, silicone series, hydrocarbon series, etc.; an ultraviolet absorbent; an antioxidant, etc.

Furthermore, not more than 50 parts by weight of ordinary resin serving as a binder, such as acrylic resin, epoxy resin, urethane resin, melamine resin, etc. may be added to the colored image forming material on the basis of 100 parts by weight of the resin represented by the formula (I) as component (a) at any time, i.e. not only during the dispersion of the coloring agent. Above 50 parts by weight, the dispersion stability of the coloring agent and the photosensitivity are unpreferably lowered.

A photosensitive solution (A') can be prepared by adding an appropriate solvent to the present colored image forming material (A). The photosensitive solution (A') can be directly applied to a substrate, or once applied to a support and the thus applied support is provided onto a substrate by lamination, whereby a film of colored image forming material is formed on the substrate surface. Then, the resulting substrate is exposed to light imagewise and developed to give the desired image pattern.

A procedure for making the photosensitive solution (A') from the present colored image forming material (A) will be described below:

when the component (b) of the colored image forming material is a dye, all the amounts of components (a), (b), (c) and (d) are mixed together, and an organic solvent is added to the mixture to make a photosensitive solution (A'). Selection of an organic solvent for making the photosensitive solution (A') is very important, because the properties of a colored image forming material depends largely on the selected organic solvent.

As the organic solvent, there can be used ketones, glycols, alcohols, and aromatic compounds usually used in this art. Preferable organic solvents are ketones such as acetone, methyl ethyl ketone, methyl isobutyl ketone, diisobutyl ketone, cyclohexanone, etc.; ethylene glycols such as ethylene glycol monomethyl ether, ethylene glycol monoethyl ether, ethylene glycol methyl ether acetate, ethylene glycol ethyl ether acetate, ethylene glycol monopropyl ether, ethylene glycol monobutyl ether, ethylene glycol butyl ether acetate, ethylene glycol monoisobutyl ether, ethylene glycol monopentyl ether, ethylene glycol monoisopentyl ether, ethylene glycol monohexyl ether, ethylene glycol monoheptyl ether, ethylene glycol monooctyl ether, ethylene glycol mono-2-ethyl hexyl ether, ethylene glycol monoallyl ether, ethylene glycol monophenyl ether, ethylene glycol monobenzyl ether, ethylene glycol dimethyl ether, ethylene glycol diethyl ether, ethylene glycol dibutyl ether, diethylene glycol ethyl ether (ethyl carbitol), diethylene glycol butyl ether (butyl carbitol), diethylene glycol isobutyl ether, diethylene glycol monohexyl ether, diethylene glycol mono-2-ethylhexyl ether, diethylene glycol dimethyl ether, diethylene glycol diethyl ether, diethylene glycol methylethyl ether, triethylene glycol monobutyl ether, triethylene glycol dimethyl ether, tetraethylene glycol dimethyl ether, tetraethylene glycol monobutyl ether, etc.; propylene glycols such as propylene glycol monomethyl ether, propylene glycol dimethyl ether, propylene glycol monoethyl ether, propylene glycol diethyl ether, propylene glycol monopropyl ether, propylene glycol dipropyl ether, propylene glycol diisopropyl ether, propylene glycol monobutyl ether, propylene glycol dibutyl ether, propylene glycol diisobutyl ether, propylene glycol t-butyl ether, propylene glycol di-t-butyl ether, propylene glycol monohexyl ether, propylene glycol monophenyl ether, propylene glycol methyl ether acetate, propylene glycol ethylether acetate, dipropylene glycol monomethyl ether, dipropylene glycol dimethyl ether, dipropylene glycol monoethyl ether, dipropylene glycol diethyl ether, dipropylene glycol monopropyl ether, dipropylene glycol monoisopropyl ether, dipropylene glycol methylisopropyl ether, dipropylene glycol ethylisopropyl ether, dipropylene glycol monobutyl ether, dipropylene glycol dibutyl ether, dipropylene glycol monoisobutyl ether, dipropylene glycol mono-t-butyl ether, dipropylene glycol monoisopentyl ether, tripropylene glycol monomethyl ether, tripropylene glycol dimethyl ether, tripropylene glycol monomethyl ether acetate, etc.; pyrrolidones such as N-methyl-2-pyrrolidone, N-hydroxymethyl-2-pyrridone, etc.; alcohols such as methyl alcohol, ethyl alcohol, isopropyl alcohol, n-butyl alcohol, etc.; lactic acid esters such as methyl lactate, ethyl lactate, butyl lactate, isobutyl lactate, t-butyl lactate, pentyl lactate, isopentyl lactate, t-pentyl lactate, etc.; other organic solvents such as 3-methyl-3-methoxybutanol, 3-methyl-3-methoxybutyl acetate, tetrahydrofuran, dioxane, benzene, toluene, xylene, ethyl acetate, etc.; and lactones such as β-lactone, γ-lactone, δ-lactone, etc. These organic solvents can be used alone or in a mixture of at least two thereof.

The solvent is used preferably in an amount so as to make the total solid content of components including the components (a), (b), (c) and (d) in the photosensitive solution 5–40% by weight. When the organic solvent is in an amount so as to make the total solid content in the photosensitive solution less than 5% by weight, it take much time in drying the film; whereas in such an amount of the organic solvent as to make the total solid content in the photosensitive solution more than 40% by weight, the viscosity of the resulting photosensitive solution becomes too high to lower the coatability.

It is not acceptable to use cellosolves such as methyl cellosolve, ethyl cellosolve, etc., or acetylated products of cellosolves such as ethyl cellosolve acetate, etc. of the ordinary organic solvents as an organic solvent for the present colored image forming material, because the stability of the resulting photosensitive solution and the appearance of the resulting film are too poor.

When the component (b) is a pigment, it is necessary to disperse the pigment. Dispersion of the pigment is usually carried out by mixing the dispersing resin as component (a) with at least one of the above-mentioned preferable solvents, and treating the resulting mixture in one of various dispersing-kneading apparatuses such as an ultrasonic disperser, a triplex roll, a ball mill, a sand mill, a bead mill, a homogenizer, a kneader, etc. Dispersibility and dispersion stability of the pigment can be improved by adding to the mixture a pigment dispersing agent such as anionic pigment dispersing agents, for example, a surfactant of polycarboxylate type polymer, a surfactant of polysulfonate type polymer, etc., nonionic pigment dispersing agents, for example, polyoxyethylene•polyoxypropylene block polymer, etc., or a derivative of organic coloring agent obtained by introducing a substituent such as a carboxyl group, a sulfonic acid group, a sulfonate group, a carboxylic acid amide group, a sulfonic acid amide group, a hydroxyl group, etc. to organic coloring agents of anthraquinone series, perylene series, phthalocyanine series, quinacridone series, etc.

It is preferable to use not more than 50 parts by weight of the pigment dispersing agent or the derivative of organic coloring agent per 100 parts by weight of the pigment.

Components (c) and (d) can be added to the dispersing resin as component (a) during or after dispersion of the pigment as component (b).

All the amount of the dispersing resin as component (a) can be used together with the pigment during the dispersion of the pigment or part of the dispersing resin is added to the dispersion. However, it is preferable to use at least 20 parts by weight of the dispersing resin during the dispersion of the pigment per 100 parts by weight of the pigment. Below 20 parts by weight, the dispersion stability of the pigment is decreased.

Likewise, all the amount of the organic solvent can be used during the dispersion of the pigment, or part of the organic solvent can be added to the dispersion. However, it is preferable to use at least 100 parts by weight of the organic solvent during the dispersion of the pigment per 100 parts by weight of sum total of the pigment and the dispersing resin existing during the dispersion. Below 100 parts by weight the viscosity during the dispersion is so high that there is a possibility of difficult dispersion particularly in a ball mill, a sand mill, a bead mill, etc.

When the component (b) is a pigment, the influence of an organic solvent is larger than when the component (b) is a dye. That is, for example, when the above-mentioned cellosolves or their acetylated products are used in place of the preferable organic solvents for use in the present invention, the dispersion stability of the pigment is considerably lowered and a good image pattern cannot be obtained.

Even in case that the component (b) is a pigment, it is preferable to use the preferable organic solvent, as in the case of a dye, in an amount so as to make the total solid content of components including the components (a), (b), (c) and (d) in the photosensitive solution 5 to 40% by weight.

The thus prepared photosensitive solution (A') can be directly applied to a substrate, for example, by a roll coater, a spin coater, spraying, a whirler, a dip coater, a curtain flow coater, a wire bar coater, a gravure coater, an air knife coater, etc.

The substrate for use in the present invention can be selected in view of uses, and includes, for example, transparent glass substrates such as white plate glass, blue plate glass, silica-coated blue plate glass, etc.; sheets, films or substrates of synthetic resin such as polyester resin, polycarbonate resin, acrylic resin, vinyl chloride resin, etc.; metallic substrates such as an aluminum plate, a copper plate, a nickel plate, a stainless steel plate, etc.; ceramic substrates; semiconductor substrates having a photoelectric converter element.

After application of the photosensitive solution, drying is carried out usually at a temperature of 50° to 130° C. for 1 to 30 minutes to obtain a film of colored image forming material on the substrate.

Without the direct application of the photosensitive solution to the substrate, a film of colored image forming material can be also formed on the substrate by once applying the photosensitive solution to a support, followed by drying, to form a layer comprising the support and a film of the colored image forming material and having a thickness of usually 0.1 to 300 μm, preferably 0.2 to 30 μm, more preferably 0.2 to 5 μm, formed on the support, thereby making a photosensitive element, and providing the photosensitive element on a substrate by lamination.

The photosensitive solution can be applied to a support by a knife coater, a gravure coater, a roll coater, spraying, etc. The support for use in the present invention includes, for example, a polyester film, a polyimide film, a polyamide film, a polypropylene film, a polystyrene film, etc. After the application, drying is carried out usually at a temperature of 50° to 130° C. for 1 to 30 minutes likewise to obtain a photosensitive element. To prevent deposition of dusts on the surface of the layer, it is desirable to provide a peelable cover film on the surface of the layer by lamination.

The peelable cover film for use in the present invention includes, for example, a polyethylene film, a polytetrafluoroethylene film, a polypropylene film, a surface-treated paper, etc. Any peelable cover film can be used in the present invention, so far as it has a smaller bonding strength between the layer and the cover film than that between the layer and the support when it is peeled off from the layer.

The thus obtained photosensitive element is provided on a substrate by lamination, for example, by peeling the cover film, if any, off from the surface layer and laying the film side of the layer directly on the surface of a substrate, preferably while pressing with heating in the atmosphere under the normal pressure or reduced pressure.

The thickness of the film of the present colored image forming material (A) provided on the substrate surface by lamination depends on uses, and is usually in a range of 0.1 to 300 μm and, in case of color filter application, is usually in a range of 0.2 to 5 μm.

In the present invention, an image pattern can be formed as follows:

The film of the present colored image forming material (A) on the substrate obtained in the above-mentioned manner is exposed to actinic light imagewise to cure the desired portions of the film.

In case of the film formed by the above-mentioned photosensitive element the exposure to the actinic light can be carried out with the support as retained on the film or as removed from the film. Even in case of the film formed on the substrate by direct application of the photosensitive solution thereto, an oxygen shield film of polyvinyl alcohol, etc. can be formed on the film surface to a thickness of 0.5 to 30 μm and then the exposure to the actinic light can be carried out through the oxygen shield film.

The light source of actinic light for use in the present invention includes, for example, a carbon arc lamp, an ultra-high pressure mercury lamp, a high pressure mercury lamp, a xenon lamp, a metal halide lamp, a fluorescent lamp, a tungsten lamp, a visible light laser, etc. Irradiation with an actinic light from the light source is imagewise carried out by a pattern exposure through a photomask or by direct picturing by scanning.

A colored image pattern as the cured portions on the film corresponding to the desired image pattern can be obtained through a successive developing step, that is, by spraying an aqueous solution containing an inorganic alkali such as sodium hydroxide, potassium hydroxide, sodium carbonate, sodium metasilicate, etc., an organic base or salt such as monoethanolamine, diethanolamine, triethanolamine, tetramethylammonium hydroxide, triethylamine, n-butylamine, etc., on to the film or dipping the film into the aqueous solution, thereby removing the unexposed portions from the film. When the exposure to the actinic light is carried out with the support as retained, the support must be removed from the film before the development.

After the development, it is preferable to subject the colored image pattern to post exposure to high pressure mercury lamp light, etc. at an intensity of 0.5 to 5 J/cm² or to post heating at a temperature of 60° to 200° C. for 1 to 60 minutes for making the image pattern stronger.

A color filter for use in liquid crystal display devices can be produced, for example, by repeating the above-mentioned procedure of directly or indirectly applying the photosensitive solution comprising the present colored image forming material and a solvent to a glass substrate, thereby forming red, green, blue and if necessary other colored picture cells, and then forming black colored image as a black matrix in the interstices between these colored picture cells, or by forming a black matrix by chromium vapor deposition or formation of black colored image at first and then forming red, green, blue and if necessary other colored picture cells likewise.

When the present colored image forming material (A) further contains a compound represented by the following formula (II) or (III), the photocurability of the pigment dispersion can be considerably improved, because the compound of formula (II) or (III) acts as a sensitizer.

That is, the present invention further provides a colored image forming material (B), which comprises:

(a') a copolymer having a carboxyl group, (b) a coloring agent, (c) a monomer having at least one photopolymerizable unsaturated bond in the molecule, as required, (d) a photoinitiator, and (e) a compound represented by the following formula (II) or (III), the compound of the formula (II) being in a tautomerismic relation to the compound of the formula (III):

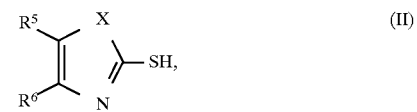

or

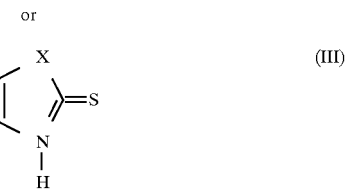

wherein X is a sulfur atom, an oxygen atom, or N—$R^7$, where $R^7$ is a hydrogen atom or an alkyl group having 1 to 5 carbon atoms, $R^5$ and $R^6$ each are a hydrogen atom, an alkyl group having 1 to 5 carbon atoms, a hydroxyalkyl group having 1 to 3 carbon atoms, a phenyl group which can have an alkoxy group having 1 to 8 carbon atoms as a substituent, a nitro group, an alkoxycarbonyl group having 1 to 8 carbon atoms, a phenoxycarbonyl group, an acetyl group or a carboxyl group, or $R^5$ and $R^6$ may be combined together to form a benzene ring, or the double bond between $R^5$ and $R^6$ may be hydrogenated.

Preferable examples of the compound of the formula (II) or (III) are as follows:

(1) 2-mercaptobenzoimidazole

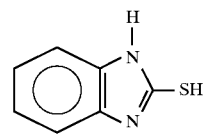

(2) 2-mercaptobenzothiazole

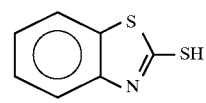

(3) 2-mercapto-4-methyl-5-acetylthiazole

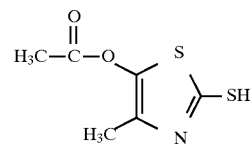

-continued (4) 2-mercapto-4-methylthiazole

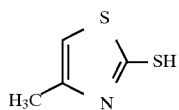

(5) 1-methyl-2-mercaptoimidazole

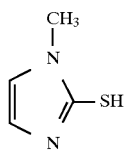

(6) 2-mercapto-4, 5-dimethylthiazole

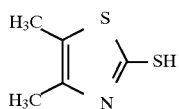

(7) 2-mercapto-5-acetylthiazole

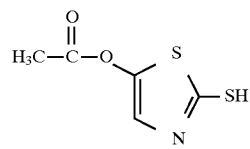

(8) 1-methyl-2-mercaptobenzoimidazole

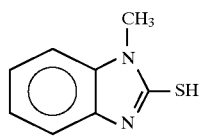

(9) 1-methyl-2-mercapto-4-methyl-5-acetylimidazole

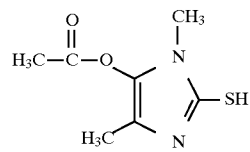

(10) 2-mercaptoxazole

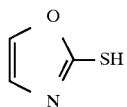

(11) 2-mercaptobenzoxazole

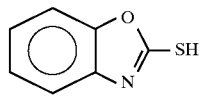

(12) 2-mercapto-2-imidazoline

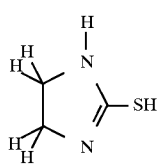

(13) Tautomers of (1)–(12), represented by the formula (III).

The present invention is not limited to those specific compounds illustrated above, but others within the formulae (II) and (III) may be employed.

It is preferable to use 0.1 to 15% by weight, more preferably 0.5 to 5% by weight, of component (e) on the basis of sum total of solid content of components (a'), (b), (c), (d) and (e). When the amount of the component (e) is less than 0.1% by weight, the effect as a sensitizer is liable to decrease, whereas when it is more than 15% by weight, the uniformality of coating film is liable to become worse.

In the present invention, the copolymer having a carboxyl group as component (a') is an essential component of the material (B). Polymer materials for alkali-developable, photosensitive resin are preferable for the component (a'). That is, copolymers of styrenic monomers with maleic acid or their derivatives (which will be hereinafter referred to as SM-based polymers), and copolymers of unsaturated monomers having a carboxyl group such as acrylic acid, metacrylic acid, etc. with styrenic monomers or other monomers such as alkyl methacrylates, for example, methyl methacrylate, t-butyl methacrylate, hydroxyethyl methacrylate, etc., or alkyl acrylates having a similar alkyl group are preferable. These copolymers have a carboxyl group so as to make an acid value preferably 30 to 200, more preferably 50 to 170.

The structural formula of SM-based polymer is given by the following formula (IV):

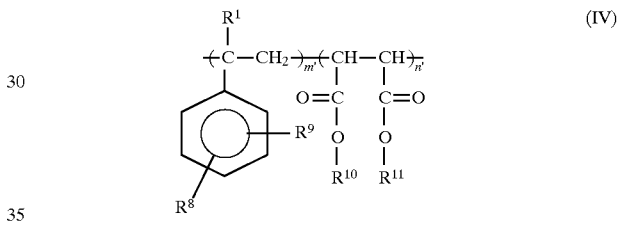

wherein $R^1$ is a hydrogen atom or a methyl group; $R^8$ is a hydrogen atom, a hydroxyl group, an alkyl group (preferably having 1 to 12 carbon atoms) or an alkoxy group (preferably having 1 to 12 carbon atoms); $R^9$ is a hydrogen atom or a hydroxyalkyl group (preferably having 1 to 12 carbon atoms); $R^{10}$ and $R^{11}$ are independently a hydrogen atom, a lower alkyl group (preferably having 1 to 4 carbon atoms), or a group having a reactive double bond, with the proviso that at least some of the groups represented by $R^{10}$ and $R^{11}$ are hydrogen; and m' and n' each are an integer of 1 or more, where m'≧n', and random copolymers and block copolymers are designated by the structural formula (IV).

In the formula (IV), plural $R^1$, $R^8$, $R^9$, $R^{10}$ or $R^{11}$ may be two or more different groups.

The copolymers include those obtained by copolymerization of styrene or its derivatives such as α-methylstyrene, m- or p-methoxy styrene, p-methylstyrene, p-hydroxystyrene, 3-hydroxymethyl-4-hydroxystyrene, etc. (which will be hereinafter referred to as "styrenic monomer" with maleic anhydride, maleic acid or maleic acid derivatives such as monomethyl maleate, monoethyl maleate, mono-n-propyl maleate, mono-iso-propyl maleate, n-butyl maleate, mono-iso-butyl maleate, mono-tert-butyl maleate, etc. (these copolymers will be hereinafter referred to as "copolymer (I)"). Copolymers (I) include those terpolymers copolymerized with alkyl methacrylates such as methyl methacrylate, t-butyl methacrylate, etc., or the like. Copolymers (I) modified with a compound having a reactive double bond (which will be herein-after referred to as "copolymer (II)") may be used as the component (a'). The copolymer as the component (a') has a weight average molecular weight (GPC in terms of polystyrene) of preferably 1,500 to 100,000.

The copolymer (II) can be prepared by partial reaction of the acid anhydride group or carboxyl group of the copolymer (I) with an unsaturated alcohol such as allyl alcohol, oleyl alcohol, cinnamyl alcohol, 2-hydroxyethyl acrylate, 2-hydroxyethyl methacrylate, N-methylol acrylamide, etc. or a compound having an oxirane ring and a reactive double bond each such as glycidyl acrylate, glycidyl methacrylate, allylglycidyl ether, α-ethylglycidyl acrylate, crotonylglycidyl ether, monoalkylmonoglycidyl itaconate ester, etc. In this case, it is essential that the necessary carboxyl group for alkali development must be retained in the copolymer.

The copolymer (II) already having the reactive double bond by reaction of the unsaturated alcohol can have a further increased countout of the reactive double bond by reaction with the compound having an oxirane ring and a reactive double bond each. The resulting copolymer will be hereinafter referred to as "copolymer (III)".

It is likewise preferable from the viewpoint of photosensitivity to give a reactive double bond to other copolymers having a carboxyl group than the SM-based polymers. These copolymers such as copolymers (I), (II), (III), etc. can be synthesized according to the procedures disclosed in JP-B 47-25470, JP-B 48-85679, JP-B 51-21572, etc.

Furthermore, the resin represented by the formula (I) described above may be employed as the component (a') of a colored image forming material (B).

Preferably 10 to 80% by weight, more preferably 20 to 70% by weight, of component (a') is used on the sum total of components (a'), (b), (c), (d) and (e). When the amount of component (a') is too small, the alkali developability is liable to decrease.

The photoinitiator for use in the present invention as component (d) of the material (B) includes, for example, benzophenone, Michler's ketone [4,4-bis(dimethylamino) benzophenone], benzyl, 2,2-diethoxyacetophenone, benzoin, benzoin methyl ether, benzoin ethyl ether, benzoin butyl ether, benzyl dimethyl ketal, α-hydroxyisobutylphenone, thioxanthone, 2-chlorothioxanthone, 1-hydroxycyclohexylphenyl ketone, 2-methyl-1-[4-(methylthio)phenyl)-2-morpholino-1-propane; alkyl-substituted or halogen-substituted anthraquinones such as t-butylanthraquinone, 1-chloroanthraquinone, 2,3-dichloroanthraquinone, p-chloroanthraquinone, 3-chloro-2-methylanthraquinone, 2-ethylanthraquinone, octamethylanthraquinone, 1,4-naphthoquinone, 9,10-phenanthraquinone, 1,2-benzoanthraquinone, 2,3-benzoanthraquinone, 1,4-dimethylanthraquinone, 2-phenylanthraquinone, etc.; bis (eta 5-2,4-cyclopentadien-1-yl)-bis[2,6-difluoro-3-(1H-pyrrol-1-yl)phenyl]titanium, 2,2-bis(o-chlorophenyl)-4,5,4', 5'-tetraphenyl-1,2'-biimidazole, 1,6-n-cumene(n-cyclopentadienyl)iron-6-fluorophosphoric acid, dibenzosperone, 10-butyl-2-chloroacridone, 2-benzyl-2-dimethylamino-1-(4-morpholinophenyl)-butane-1-on; and other sensitizers such as carbon tetrachloride, ω, ω, ω-tribromomethylphenylsulfone, 7,5,9,10-tetraphenylsulfone, 1,2,3,4-tetrahydroanthracene, etc.

Preferably 0.01 to 25% by weight, more preferably 1 to 20% by weight, of component (d) is used on the basis of sum total of components (a'), (b), (c), (d) and (e).

Addition of other amines with component (e) is effective for enhancing the curing rate and reducing the polymerization-inhibiting action by oxygen, etc. These additional amines include, for example, primary amines such as butylamine, hexamethylenediamine, diethylenetriamine, triethylenetriamine, monoethanolamine, etc., and secondary amines such as diethylamine, dimethylaniline, diethanolamine, triethanolamine, triethanolamine acrylate, dimethyl-p-toluidine, pyridine, methyldiethanolamine, N,N'-dimethylcyclohexylamine, etc.

Preferably 0.01 to 17% by weight, more preferably 2 to 10% by weight, of these additional amine is used on the basis of sum total of components (a'), (b), (c), (d) and (e). When the amount of the additional amines is too small, the photosensitivity is liable to decrease; whereas when it is too large, the adhesiveness is liable to decrease and the dried film becomes sticky.

The monomer having at least one photopolymerizable unsaturated bond in the molecule for use in the present invention as component (c) of the material (B) includes, for example, polyfunctional monomers such as trimethylolpropane triacrylate, trimethylolpropane diacrylate, triethylene glycol diacrylate, diethylene glycol diacrylate, tetraethylene glycol diacrylate, hexamethylene glycol diacrylate, neopentyl glycol diacrylate, furfuryl acrylate, tetramethylolmethane tetracrylate, resorcinol diacrylate, p,p'-dihydroxydiphenyl diacrylate, spiroglycol diacrylate, cyclohexanedimethylol diacrylate, bisphenol A diacrylate, polypropyleneglycol diacrylate, dipentaerythritol hexacrylate, compounds of the above-mentioned methacrylate structures, methylene bisacrylamide, urethane-based diacrylates, etc., and further includes, for example, monofunctional monomers such as methyl methacrylate, ethyl methacrylate, n-butyl methacrylate, isobutyl methacrylate, 2-ethylhexyl methacrylate, cyclohexyl methacrylate, tetrahydrofurfuryl methacrylate, benzyl methacrylate, mono(2-methacryloyloxyethyl) acid phosphate, dimethylaminoethyl methacrylate quaternary compound, etc. These components (c) can be used alone or in a mixture of at least two thereof. Preferably 1 to 30% by weight, more preferably 5 to 25% by weight, of component (c) is used on the basis of sum total of solid content of components (a'), (b), (c), (d) and (e). When the amount of component (c) is too small, there is a low tendency to increase the effect of improving the photosensitivity, whereas when it is too large, the adhesiveness is liable to decrease and the dried film becomes sticky.

Preferable and effective coloring agent for use in the present colored image forming material (B) as component (b) includes inorganic pigments and organic pigments, however dyes can be used as well.

Organic pigments include, for example, azo pigments such as solvent-insoluble azo series, where the solvent includes water, condensation series, etc., phthalocyanine pigments and other pigments of indigo series, anthraquinone series, perylene series, quinacridone series, methane-azomethine series, isoindolinone series, etc.

As organic pigments for the three primary colors, i.e. blue, green and red, pigments of phthalocyanine series are used for blue color and include, for example, C.I. Pigment Blue 6 (C.I. No 74160) and C.I. Pigment 60 (C.I. No. 69800), which can be mixed with C.I. Pigment Violet 23 to improve the color reproducibility.

Pigments of halogenophthalocyanine series are used for green color and include, for example, C.I. Pigment Green 7 (C.I. No. 74260), C.I. Pigment Green 36 (C.I. No. 74265), and C.I. Pigment Green 37 (C.I. No. 74255), which can be mixed, for example, with a yellow pigment such as C.I. Pigment Yellow 139 (no C.I. number) or C.I. Pigment Yellow 83 (C.I. No. 21108) to improve the color reproducibility.

Pigments of quinacridone series and red pigments of anthraquinone series are used for red color, and include, for example, C.I. Pigment Red 209 (C.I. No. 73905) and C.I. Pigment Red 177 (C.I. No. 65300), which can be mixed, for example, with a yellow pigment such as C.I. Pigment Yellow 189 or C.I. Pigment Yellow 83 to improve the color reproducibility, as in case of green color.

Inorganic pigments include, for example, chromium oxide, ultramarine blue, cadmium yellow, cadmium red, cobalt green, cobalt blue, chrome yellow, etc.

As organic pigments for complementary colors for the three primary colors, that is, Cyan, Magenta and Yellow, for example, C.I. Pigment 15:3 (C.I. No. 74160) is used for Cyan; for example, C.I. Pigment 57:3 (C.I. No. 15850:1) is used for Magenta; and, for example, C.I. Pigment Yellow 12 (C.I. No. 21090) is used for Yellow.

Coloring agent (b) for black matrix includes, for example, carbon black, titanium carbon, iron black, etc.

Dispersion of these pigments is carried out in an ultrasonic disperser, a triplex roll, a bead mill, a homogenizer, etc. The bead mill is provided with beads of zirconia, etc. therein and serves to pulverize the pigments or the like by high speed revolution of a rotor.

Preferably 5 to 50% by weight, more preferably 10 to 40% by weight, of the coloring agent (b) is used on the basis of sum total of components (a'), (b), (c), (d) and (e).

The present colored image forming material (B) may contain a polymerization inhibitor for suppressing dark reaction. The polymerization inhibitor includes, for example, hydroquinone, p-methoxydiphenol, 2,6-di-t-butyl-p-cresol, 2,2'-methylenebis(4-methyl-6-t-butylphenol) cupferron, etc.

Preferably 0.001 to 1% by weight, more preferably 0.1 to 0.5% by weight, of the polymerization inhibitor is used on the basis of sum total of solid components in the present stored image forming material (B). When the amount of the polymerization inhibitor is too small, no effect of the polymerization inhibitor can be obtained, whereas when it is too large, the photosensitivity is decreased.

The present colored image forming material (B) can be used as a photosensitive solution (B') as it is, i.e. without any addition of a solvent or dissolved into an appropriate solvent to make the photosensitive solution (B'). The photosensitive solution (B') can be applied to a support, followed by drying, thereby obtaining a photosensitive element.

When the colored image forming material (B) issued as the photosensitive solution (B') as it is, i.e. without any addition of a solvent, the monomer is used as a diluent in such an amount as to dissolve other compounds, but since the dark reaction is accelerated, as compared with the case of using a solvent, it is necessary to add a little larger amount of the polymerization inhibitor thereto.

The solvent, if required to add to make the sensitive solution (B') includes, for example, a ketonic solvent, a cellosolvic solvent, an alcoholic solvent, an etheric solvent, a non-polar solvent, etc., and more particularly includes such solvents as methylethyl ketone, acetone, cyclohexane, methylcellosolve, ethylcellosolve, butylcellosolve, methylcellosolve acetate, ethylcellosolve acetate, butylcellosolve acetate, ethylene glycol monopropyl ether, ethylene glycol mono-n-hexyl ether, ethylene glycol dimethyl ether, diethylene glycol ethyl ether, triethylene glycol dimethyl ether, propylene glycol monomethyl ether, dipropylene glycol monomethyl ether, propylene glycol monopropyl ether, propylene glycol monobutyl ether, tripropylene glycol monomethyl ether, propylene glycol monomethyl ether acetate, 3-methyl-3-methoxybutanol, 3-methyl-3-methoxybutyl acetate, propylene glycol monomethyl ether propionate, N-methyl-2-pyrrolidone, N-hydroxymethyl-2-pyrrolidone, N-hydroxyethyl-2-pyrrolidone, methyl alcohol, ethyl alcohol, isopropyl alcohol, tetrahydrofuran, dioxane, benzene, toluene, xylene, ethyl acetate, etc. These solvents can be used alone or in a mixture of at least two thereof.

It is preferable to use the solvent in such an amount as to make the solid content of the photosensitive solution (B') 10 to 60% by weight. When the amount of the solvent is too large, the dispersion stability is liable to decrease, whereas, when it is too small, the effect on lowering of the viscosity, etc. is poor or gellation is liable to occur.

The substrate, to which the photosensitive solution (B') is applied, includes a transparent glass plate, that is, blue plate glass, mainly non-alkali glass, aluminum silicate glass, quartz glass, etc., which are used mainly for color filters. Other substrates include an acrylic resin plate, a vinyl chloride resin plate, and such metal plates as a copper plate, an aluminum plate, a nickel plate, a stainless steel plate, etc.

The photosensitive solution (B') can be applied to the substrate in the same manner as in the case of the photosensitive solution (A'). After the application of the photosensitive solution (B') to the substrate, a dried film of the colored image forming material (B) can be formed on the substrate to a thickness of a few $\mu$m by natural drying or forced drying based on heating.

The film can be also formed on the substrate by applying the photosensitive solution (B') to a support, thereby making a photosensitive element and providing the photosensitive element on the substrate by lamination in the same manner as in the case of the photosensitive solution (A'). This procedure is particularly effective when the photosensitive solution cannot be directly applied to the substrate.

The photosensitive solution (B') can be applied to the support in the same manner as the photosensitive solution (A') is applied to the substrate.

The support for use in the present invention includes, for example, polyester film, a polyamide film, a polyimido film, a polypropylene film, a polystyrene film, etc.

After the application to the support film, drying is carried out in the ordinary manner, that is, by natural drying, forced drying, etc. To prevent deposition of dusts, etc. on the film formed on the support, it is desirable to provide a peelable cover film on the surface of the formed film by lamination.

The peelable cover film for use in the present invention includes, for example, a polyethylene film, a tetrafluoroethylene film and a polypropylene film. Any peelable cover film can be used in the present invention, so far as it has a smaller bonding strength than that of the support.

The photosensitive element can be provided on a substrate by lamination, that is, by peeling the cover film, if any, off from the photosensitive element and laying the film side directly on the surface of a substrate, preferably while pressing with heating, whereby the adhesiveness can be increased.

The thickness of the film of the present colored image forming material (B) provided on the substrate surface by lamination depends on uses, and is usually in a range of 0.1 to 500 $\mu$m and, in case of color filter application, is usually in a range of 0.1 to 5 $\mu$m.

The image pattern can be obtained in the same manner as in the case of the material (A).

The photosensitive layer as the dried film is exposed to active light to cure the desired portions of the film.

The source of the actinic light applicable to the present photosensitive layer includes, for example, a carbon arc lamp, an ultra-high pressure mercury lamp, a high pressure mercury lamp, a xenon lamp, a metal halide lamp, a fluorescent lamp, a tungsten lamp, etc.

The successive development step, etc. can be carried out in the same manner as in the case of the material (A).

A color filter obtained according to the present invention is shown, for example, in FIG. 1, where numeral 1 is ITO (indium tin oxide), 2 a picture cell, 3 a protective film, 4 a black matrix and 5 a glass substrate.

The protective film is usually formed by coating a thermosetting resin, preferably having high heat resistance, such as an epoxy resin, an acrylic resin, a melamine resin, etc. The IPO is usually formed by a vapor deposition method.

Figure 2:
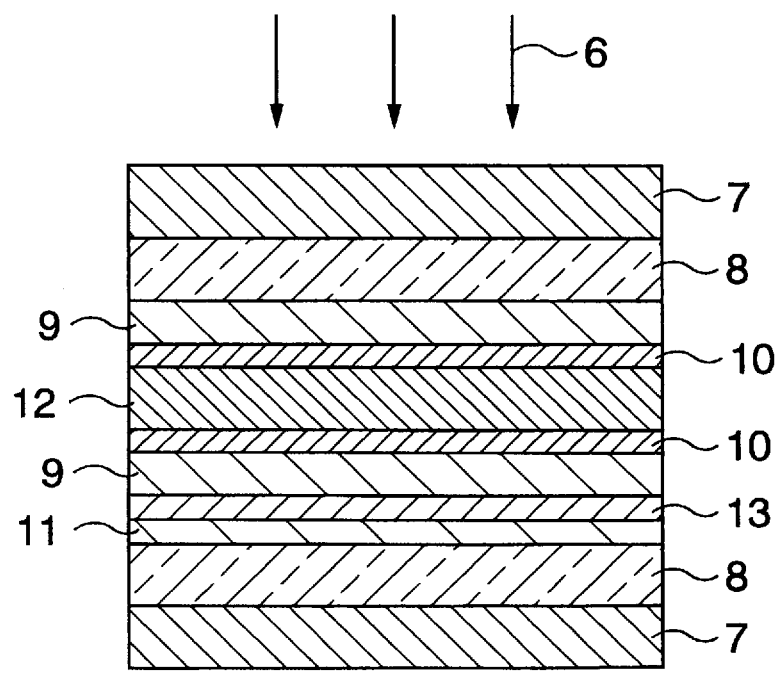
FIG. 2 is a cross-sectional view of a liquid crystal display device using a color filter according to the present invention.

The color filter can be used in a liquid crystal display device as shown in FIG. 2, where numeral 6 is a backlight, 7 a polarizing filter, 8 a glass electrode, 9 a transparent electrode, 10 an orientating film, 11 a color filter, 12 a liquid crystal and 13 a protective film.

The present invention will be explained in detail below, referring to Example, where parts or % are all by weight, unless otherwise specified.

EXAMPLE 1

40 g of dispersing resin represented by the formula (I) and shown in Table 1 as component (a), and 25 g of C.I. Pigment Red 177 and 5 g of C.I. Pigment Yellow 139 as component (b) were added to 200 g of diethylene glycol dimethyl ether, and then the resulting mixture was subjected to dispersion in a bead mill for 2 hours. Then, 10 g of the above-mentioned dispersing resin, 30 g of trimethylolpropane triacrylate as component (c) and 6 g of benzophenone, 2 g of N,N'-tetraethyl-4,4'-diaminobenzophenone and 280 g of ethylene glycol dimethyl ether as component (d) were added to 200 g of the resulting dispersion, followed by mixing, whereby a photosensitive solution containing a colored image forming material was obtained.

Then, the photosensitive solution was applied to a glass substrate (7059, trademark of Corning glass Works) by spin coating and dried at 80° C. for 5 minutes, whereby a film having a thickness of 2.0 $\mu$m was formed on the substrate.

The thus obtained film was exposed to light at 80 mJ/cm$^2$ from an ultra high pressure mercury lamp imagewise through a negative mask, and then developed with an aqueous solution containing 6% by weight of triethanolamine. Evaluation results of photosensitivity and pattern shape of the thus obtained red image pattern are shown in Table 2.

EXAMPLE 2

60 g of dispersing resin represented by the formula (I) and shown in Table 1 as component (a), and 22 g of C.I. Pigment Green 36 and 8 g of C.I. Pigment Yellow 83 as component (b) were added to 250 g of diethylene glycol diethyl ether, and the resulting mixture was subjected to dispersion in a head mill for 2 hours. Then, 32 g of pentaerythritol tetracrylate as component (c) and 6 g of benzophenone, 3 g of N,N'-tetraethyl-4,4'-diaminobenzophenone and 125 g of diethylene glycol monomethyl ether acetate as component (d) were added to 220 g of the resulting dispersion, followed by mixing, whereby a photosensitive solution containing a colored image forming material was obtained.

The photosensitive solution was applied to a glass substrate and dried in the same manner as in Example 1, whereby a film having a thickness of 2.0 $\mu$m was formed on the substrate.

The thus obtained film was subjected to light exposure and development in the same manner and under the same conditions as in Example 1. Evaluation results of photosensitivity and pattern shape of the thus obtained green image pattern are shown in Table 2.

EXAMPLE 3

25 g of dispersing resin represented by the formula (I) and shown in Table 1 as component (a) and 24 g of C.I. Pigment Blue 15-6 and 1 g of C.I. Pigment Violet 23 as component (b) were added to 200 g of γ-lactone, and the resulting mixture was subjected to a bead mill for 2 hours. Then, 36 g of the above-mentioned dispersing resin, 30 g of 1,4-butanediol diacrylate as component (c), and 6 g of benzophenone, 2 g of N,N'-tetraethyl-4,4'-diaminobenzophenone and 230 g of diethylene glycol diethyl ether as component (d) were added to 140 g of the resulting dispersion, followed by mixing, whereby a photosensitive solution containing a colored image forming material was obtained.

The resulting photosensitive solution was applied to a glass substrate and dried in the same manner as in Example 1, whereby a film having a thickness of 2.0 $\mu$m was formed on the substrate.

The film was subjected to light exposure and development in the same manner and under the same conditions as in Example 1.

Evaluation results of photosensitivity and pattern shape of the thus obtained blue image pattern are shown in Table 2.

EXAMPLE 4

The photosensitive solution obtained in Example 1 was applied to a polyethylene terephthalate film having a thickness of 6 $\mu$m by gravure coating and dried at 100° C. for 2 minutes, whereby a film having a thickness of 2.0 $\mu$m was formed on the polyethylene terephthalate film. Then, the thus obtained film was covered with a polyethylene film having a thickness of 40 $\mu$m, whereby a photosensitive element was obtained.

After the polyethylene film was removed from the photosensitive element, the photosensitive film side of the remaining photosensitive element was laid on a glass substrate as used in Example 1 by lamination under such lamination conditions as a glass substrate temperature of 40° C., a lamination roll temperature of 110° C., a lamination pressure of 3.5 kgf/cm$^2$ and a lamination speed of 1.5 m/min.

Then, the laminate was subjected to imagewise exposure of light at 40 mJ/cm$^2$ from an ultra high pressure mercury lamp from the polyethylene terephthalate film side through a negative mask. After the polyethylene terephthalate film was removed from the laminate, the remaining laminate was developed in the same manner and under the same conditions as in Example 1.

EXAMPLE 5

A red image pattern was formed on a glass substrate, as used in Example 1, on which a black matrix was formed by chromium vapor deposition in advance, in the same manner and under the same conditions as in Example 1, and then subjected to post-heating at 150° C. for 10 minutes. Then, a green image pattern was formed adjacently to the red image pattern on the substrate in the same manner and under the same conditions as in Example 2, and then subjected to post-heating at 150° C. for 10 minutes.

Then, a blue image pattern was formed adjacently to the green image pattern on the substrate in the same manner and under the same conditions as in Example 3 and then subjected to post-heating at 150° C. for 10 minutes.

In this manner, a color filter having tricolor, i.e. red, green and blue picture cells, each in size of 30 $\mu$m×100 $\mu$m, arranged in a mosaic pattern, was obtained.

EXAMPLE 6

A red image pattern was formed on a glass substrate, as used in Example 1, on which a black matrix was formed by chromium vapor deposition in advance, in the same manner and under the same conditions as in Example 4, and then subjected to post-heating at 150° C. for 10 minutes.

Then, a photosensitive element was prepared from the photosensitive solution obtained in Example 2 in the same manner and under the same conditions as in Example 4.

Then, the thus obtained photosensitive element was laid on the above-mentioned substrate by lamination and subjected to light exposure in the same manner and under the same conditions as in Example 4 and, after removal of the polyethylene terephthalate film, was subjected to development in the same manner and under the same conditions as in Example 2, whereby a green image pattern was formed adjacently to the red image pattern. Then, post-heating was carried out at 150° C. for 10 minutes.

Another photosensitive element was prepared from the photosensitive solution obtained in Example 3 in the same manner and under the same conditions as in Example 4, and the thus obtained photosensitive element was laid on the above-mentioned substrate by lamination and subjected to light exposure in the same manner and under the same conditions as in Example 4, and, after removal of the polyethylene terephthalate film, was subjected to development in the same manner and under the same conditions as in Example 3, whereby a blue image pattern was formed adjacently to the green image pattern. Then, post-heating was carried out at 150° C. for 10 minutes.

In this manner, a color filter having tricolor, i.e. red, green and blue picture cells, each in size of 30 $\mu m \times 100$ $\mu m$, arranged in a mosaic pattern, was obtained.

Comparative Examples 1 and 2

Photosensitive solutions with the same compositions were prepared in the same manner and under the same conditions as in Example 2 except that 60 g of the dispersing resins shown in Table 1 were used as dispersing resins in place of the dispersing resin represented by the formula (I).

Films having a thickness of 2.0 $\mu m$ were prepared from these photosensitive solutions, respectively, and then subjected to light exposure and development in the same manner and under the same conditions as in Example 1. Evaluation results are shown in Table 2.

Comparative Example 3

A photosensitive solution with the same composition was prepared in the same manner and under the same conditions as in Example 3 except that the same amount of polyvinyl pyrrolidone (K-90, trademark of a product made by GAF) was used as a dispersing resin in place of the dispersing resin represented by the formula (I).

A film having a thickness of 2.0 $\mu m$ was prepared from the photosensitive solution and subjected to light exposure and development in the same manner and under the same conditions as in Example 3. Evaluation results are shown in Table 2.

Comparative Example 4

A photosensitive solution with the same composition was prepared in the same manner and under the same conditions as in Example 3 except that the same amount of cellulose acetate-phthalate (degree of polymerization: 100, a product made by Wako Junyaku K.K., Japan) was used as a dispersing resin in place of the dispersing resin represented by the formula (I).

A film having a thickness of 2.0 $\mu m$ was prepared from the photosensitive solution and subjected to light exposure and development in the same manner and under the same conditions as in Example 3. Evaluation results are shown in Table 2.

Comparative Example 5

A photosensitive solution with the same composition was prepared in the same manner and under the same conditions as in Example 1 except that the same amount of ethyl cellosolve was used as an organic solvent in place of diethylene glycol dimethyl ether.

A film having a thickness of 2.0 $\mu m$ was prepared from the photosensitive solution and subjected to light exposure and development in the same manner and under the same conditions as in Example 1. Evaluation results are shown in Table 2.

Comparative Example 6

A photosensitive solution with the same composition was prepared in the same manner and under the same conditions as in Example 1 except that the same amount of ethyl cellosolve acetate was used as an organic solvent in place of diethylene glycol dimethyl ether.

A film having a thickness of 2.0 $\mu m$ was prepared from the photosensitive solution and subjected to light exposure and development in the same manner and under the same conditions as in Example 1. Evaluation results are shown in Table 2.

Evaluation results of dispersion stability of the photosensitive solutions prepared in Examples 1, 2 and 3 and Comparative Examples 1, 2, 3, 4, 5 and 6, and appearances of the films prepared therefrom are also shown in Table 2.

It can be seen from Table 2 that, when different resins from the dispersing resins of the present invention were used as dispersing resins during the dispersion of pigment (Comparative Examples 1, 2, 3 and 4, the dispersion stability of the photosensitive solutions and the appearance and photosensitivity of the resulting films were not better than those of Examples, whereas, when the dispersing resins of the present invention were used during the dispersion of pigment (Examples 1, 2 and 3), the dispersion stability of the present photosensitive solutions was not changed at all even after 30 days, and the present photosensitive solutions were in a stable state, while keeping a good film appearance and a uniform film thickness, and further that the photosensitivity of the present films was much higher than that of Comparative Examples 1, 2, 3 and 4 and image patterns of high resolution were obtained in the present invention.

It was also found that, when resins having a high hydroscopicity were used as a dispersing resin, as in Comparative Examples 3 and 4, the films were much influenced with a humidity during the light exposure, that is, the optical sensitivity was considerably lowered, for example, to less than Step No. 1 when exposed to light at a humidity of at least 75% RH, and no image pattern was obtained at all, whereas in the case of using the present dispersing resins as in Examples 1, 2 and 3 the films were not influenced with a humidity at all and a sufficiently high photosensitivity of the same level as that shown in Table 2 was obtained, even when exposed to light at a high humidity.

Influence of organic solvents is obvious from comparison of Example 1 with Comparative Examples 5 and 6. That is, in Example 1 using the preferable organic solvent of the present invention good characteristics were obtained throughout all the items, whereas selection of inappropriate solvents lowered the pigment dispersibility, resulting in poor appearance of films and poor resolution of patterns (Comparative Examples 5 and 6).

In the case of the photosensitive element shown in Example 4, the optical sensitivity was improved, as compared with Examples 1, 2 and 3, showing the step number and resolution of the same level as in Example 1, even when exposed to light at 40 mJ/cm$^2$.

Color filters prepared from the photosensitive solutions comprising a colored image forming material having unexpectedly distinguished characteristics and an organic solvent suitable for the colored image forming material (Examples 5 and 6) had such a distinguished optical characteristic as a degree of depolarization of 500 or more and were found to be effective for the image display device.

As described above, the present colored image forming material (A), the photosensitive solution (A') comprising the material (A) and the photosensitive element prepared from the solution (A') have a good dispersion stability, optical sensitivity, etc.

The present color filter produced according to the present process for producing the same from the photosensitive solution or the photosensitive element has good optical characteristics and is useful for the image display device.

TABLE 1

Dispersing resin

| Example No. | $R^1$ | $R^2$ | $R^3$ | $R^4$ | | m/n | Acid value | Unsaturation equivalent weight | Weight average molecular weight |
|---|---|---|---|---|---|---|---|---|---|
| Ex. 1 | —H | —H | —$C_3H_7$ | ①—H  ② $CH_2$=$C(CH_3)$—$COOCH_2CHCH_2$— with OH | 1) | 2/1 | 80 | 1060 | $1.5 \times 10^4$ |
| Ex. 2 | —$CH_3$ | —H | —$CH_3$ | Same as above | | 3/2 | 93 | 910 | $1.0 \times 10^4$ |
| Ex. 3 | —H | —$CH_3$ | —$C_2H_5$ | ①—H  ② $CH_2$=$CH$—$COOCH_2CH_2$— | 2) | 1/1 | 90 | 622 | $2 \times 10^4$ |
| Comp. Ex. 1 | —H | —H | —$C_3H_7$ | ①—H  ②—$CH_3$ | 3) | 2/1 | 75 | — | $1.5 \times 10^4$ |
| Comp. Ex. 2 | Methacrylic acid/methyl methacrylate/butyl acrylate copolymer | | | | | | 75 | — | $2 \times 10^4$ |

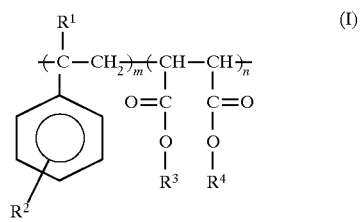

(I)

Note 1) 1/2 Equivalent weight ratio = 0.6/0.4
2) 1/2 Equivalent weight ratio = 0.5/0.5
3) 1/2 Equivalent weight ratio = 0.5/0.5
4) A product obtained by reaction of the copolymer of styrene and maleic anhydride with the same moles of isopropyl alcohol as the moles A of the maleic anhydride moiety of the copolymer and then by reaction with glycidyl methacrylate.
5) A product obtained by reaction of the copolymer of α-methylstyrene and maleic anhydride with the same moles of methyl alcohol as the moles A of the maleic anhydride moiety of the copolymer and then by reaction with glycidyl methacrylate.
6) A product obtained by reaction of the copolymer of methyl styrene and maleic anhydride with the same moles of ethyl alcohol as the moles A of the maleic anhydride moiety of the copolymer and by reaction with hydroxy ethyl acrylate.

TABLE 2

Evaluation results

| | Photosensitive solution Dispersion stability (day)[1] | Film appearance[2] | Photosensitivity | | |
|---|---|---|---|---|---|
| Example No. | | | Optical sensitivity (Step number)[3] | Resolution (μm) | Pattern shape |
| Ex. 1 | 30 days or more | good | 7 | 5 | rectangle |
| Ex. 2 | 30 days or more | good | 7 | 5 | rectangle |
| Ex. 3 | 30 days or more | good | 9 | 5 | rectangle |

TABLE 2-continued

Evaluation results

| | Photosensitive | | Photosensitivity | | |
|---|---|---|---|---|---|
| Example No. | solution Dispersion stability (day)[1] | Film appearance[2] | Optical sensitivity (Step number)[3] | Resolution (μm) | Pattern shape |
| Comp. Ex. 1 | 18 days | somewhat poor | 1 | 150 | Partly corroded with developing solution |
| Comp. Ex. 2 | 2 days | poor (with much uneven coating) | 1 | — | No pattern was obtained |
| Comp. Ex. 3 | 15 days | Somewhat poor | 3 | 100 | Partly corroded with developing solution |
| Comp. Ex. 4 | 12 days | Somewhat poor | 3 | 100 | Partly corroded with developing solution |
| Comp. Ex. 5 | 10 days | poor (with much uneven coating) | 4 | 40 | Pattern edges were cracked |
| Comp. Ex. 6 | 8 days | poor (with much uneven coating) | 4 | 40 | Pattern edges were cracked |

Note)
[1]Days required until the secondary coagulation takes place, when left standing at 25° C., after the preparation of the photosensitive solution.
[2]Appearance of a film formed by application of the photosensitive solution just after the preparation.
[3]Evaluation with 21 step tablets (ST), where an optical density increases by 0.15 for each step, while designating the optical density of 0.05 as step number 1.

EXAMPLE 7

(Color filter)

At first, a dispersion was prepared. That is, a dispersion (I) was prepared by dispersing a copolymer resin (polymer A) as component (a) and pigments in a solvent in a bead mill for 3 hours. The polymer A was a styrene-maleic acid-based resin (the molar ratio of styrene/maleic acid is 55/45) having a weight average molecular weight of 11,000 (in terms of polystyrene), an acid value of 75, and an unsaturation equivalent weight of 244, represented by the formula (IV), where $R^1$ is a hydrogen atom; $R^8$ and $R^9$ each are a hydrogen atom; 50% of $R^{10}$ and $R^{11}$ comprises a group represented by the following formula:

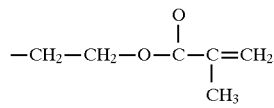

35% of $R^{10}$ and $R^{11}$ comprises a group represented by the following formula:

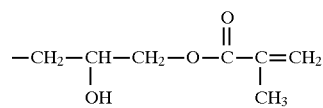

and 15% of $R^{10}$ and $R^{11}$ comprises hydrogen atoms (that is, a product obtained by reaction of the copolymer of styrene and maleic anhydride with the same moles of 2-hydroxyethyl methacrylate as the moles A of the maleic anhydride moiety of the copolymer and then by reaction with 70% of the same moles of glycidyl methacrylate as the moles A). As the pigments, C.I. Pigment blue 15:6 and C.I. Pigment 23 were used in a ratio of the former to the latter of 91:9. As the solvent, γ-butyrolactone was used. The composition of the dispersion (I) was 37.5% copolymer resin, 15% pigments, and 50% solvent γ-butyrolactone. A dispersing agent A-600 (trademark of a product made by Daiichi Kogyo Seiyaku K.K., Japan) was used in a proportion of 2.5% in the dispersion (I). Average particle size of the dispersion (I) was measured by particle analyzer, Horiba-CAPA-700 and was found to be 0.3 μm.

A photosensitive material for preparing a color filter was prepared by mixing the dispersion (I) in a stirrer with other components as set forth in Table 3 to prepare a photosensitive solution. Viscosity was measured by E type viscometer made by Tokimec, and found to be 44 m·Pa·S. Formulation of the photosensitive solution was given in Table 3. The viscosity of the photosensitive solution was likewise measured and found to be 24 m·Pa·S.

TABLE 3

| Resin (a') | |
|---|---|
| Polymer A | 78 parts |
| Monomer (c) | |
| Trimethylolpropane triacrylate | 30 parts |
| Photo-initiator (d) | |
| Benzophenone | 8 parts |
| Benzoin ethyl ether | 8 parts |
| Sensitizer (e) | |
| 2-mercapto-benzoimidazole* | 1.5 parts |
| Solvent | |
| N-methylpyrrolidone | 5 parts |
| γ-butyrolactone | 500 parts |

TABLE 3-continued

| | | |
|---|---|---|
| Polymerization inhibitor | | |
| p-methoxyphenol | 0.1 | part |
| Surfactant | | |
| Perfluoralkyl alkoxylate | 0.01 | part |
| Dispersion [I] | | |
| Including a coloring agent (b). | 48 | parts |

Note)
*Including the tautomer

The thus obtained photosensitive solution was applied to a glass substrate (7059, trademark of a product made by Corning Glass Works) by spinner at 1,200 rpm, and dried. The dried film had a thickness of 2.0 μm. The dispersion stability of the pigment-dispersed photosensitive solution was very good. The dried film was transparent and had a stable dispersion. Then, a glass mask of triangular mosaic pattern was tightly laid on the film and the film was exposed to the light from an ultra high pressure mercury lamp made by ORC Seisakusho, Ltd., Japan at 130 mJ/cm². Step tablets (21 steps) made by Eastman Kodak Co. were exposed to the light at the same time for the sensitivity measurement. Then, the exposed film was developed by dipping in a developing solution with composition given in the following table 4 at a developing temperature of 25° C. for a developing time of 70 seconds. No irregularity was found at the edges of pattern (picture cells).

TABLE 4

| | | |
|---|---|---|
| triethanolamine | 6 | wt. % |
| isopropanol | 0.5 | wt. % |
| water | 93.5 | wt. % |
| Total | 100 | wt. % |

The thus obtained pattern was well applicable as a color filter. The optical sensitivity was step No. 7 of Kodak step tablets.

EXAMPLE 8
(Color filter)

A color filter was prepared in the same manner as in Example 7, using the same dispersion (I) as in Example 7 according to the formulation given in the following Table 5.

TABLE 5

| | | |
|---|---|---|
| Resin (a') | | |
| Polymer A | 75 | parts |
| Monomer (c) | | |
| Trimethylolpropane triacrylate | 30 | parts |
| Photo-initiator (d) | | |
| Benzophenone | 8 | parts |
| Benzoin ethyl ether | 8 | parts |
| Sensitizer (e) | | |
| 2-mercapto-benzoimidazole* | 4.5 | parts |

TABLE 5-continued

| | | |
|---|---|---|
| Solvent | | |
| N-methylpyrrolidone | 5 | parts |
| γ-butyrolactone | 500 | parts |
| Polymerization inhibitor | | |
| p-methoxyphenol | 0.1 | part |
| Surfactant | | |
| Perfluoroalkyl alkoxylate | 0.01 | part |
| Dispersion [I] | | |
| Including a coloring agent (b). | 48 | parts |

Note)
*Including the tautomer.

Viscosity as measured was 44 m·Pa·S. A color filter pattern was formed through an application step at 1,200 rpm, a drying step at 80° C. for 10 minutes, a light exposure step at 130 mJ/cm², and a developing step with the same developing solution as in Example 7 for a developing time of 70 seconds in the same manner as in Example 7. Step number was 8.

EXAMPLE 9
(Color filter)

A color filter was prepared in the same manner as in Example 7, using the dispersion (I) according to formulation given in the following Table 6.

TABLE 6

| | | |
|---|---|---|
| Resin (a') | | |
| Polymer A | 75 | parts |
| Monomer (c) | | |
| Trimethylolpropane triacrylate | 30 | parts |
| Photo-initiator (d) | | |
| Benzophenone | 8 | parts |
| Benzoin ethyl ether | 8 | parts |
| Sensitizer (e) | | |
| 2-mercapto-benzoimidazole* | 4.5 | parts |
| Solvent | | |
| N-methylpyrrolidone | 5 | parts |
| γ-butyrolactone | 500 | parts |
| Polymerization inhibitor | | |
| p-methoxyphenol | 0.1 | part |
| Surfactant | | |
| Perfluoroalkyl alkoxylate | 0.01 | part |
| Dispersion [I] | | |
| Including a coloring agent (b). | 48 | parts |

Note)
*Including the tautomer

Viscosity as measured was 44 m·Pa·S. A color filter pattern was formed through an application step at 1,200 rpm, a light exposure step at 130 mJ/cm², and a developing step for a developing time of 70 seconds in the same manner as in Example 7. Step number was 6.

EXAMPLE 10

(Color filter)

The dispersion was prepared in the same manner as in Example 7. Formulation for a color filter photosensitive solution is given in the following Table 7, where the formulation was almost the same as that of Table 3 except for 2-mercaptobenzoimidazole was excluded and the amount of polymer A having no influence on the sensitivity was a little increased.

TABLE 7

| Resin (a') | |
|---|---|
| Polymer A | 79.5 parts |
| Monomer (c) | |
| Trimethylolpropane triacrylate | 30 parts |
| Photo-initiator (d) | |
| Benzophenone | 8 parts |
| Benzoin ethyl ether | 8 parts |
| Solvent | |
| N-methylpyrrolidone | 5 parts |
| γ-butyrolactone | 500 parts |
| Polymerization inhibitor | |
| p-methoxyphenol | 0.1 part |
| Surfactant | |
| Perfluoroalkyl alkoxylate | 0.01 part |
| Dispersion [I] | |
| Including a coloring agent (b). | 48 parts |

Viscosity as measured was 44 m·Pa·S, which was the same as that of the photosensitive solution of Example 7. The thus obtained photosensitive solution was applied to a provisional support of polyethylene terephthalate having a thickness of 100 μm by a roll coater and dried at 100° C. for 2 minutes, whereby a sheet comprising a photosensitive element having a thickness of 2 μm was obtained. Then, the thus obtained sheet was laid on a glass substrate by lamination, using a laminator (fast laminator 8B-550-80, trademark of a product made by Taisei Shoji K.K.) at a roller temperature of 105° C. and a lamination rate of 0.9 m/min. Then, the film was exposed to light from a 2 kW ultra high pressure mercury lamp made by ORD Seisakusho, Ltd. at 130 mJ/cm² through a glass negative mask of triangular mosaic pattern. At the same time, 21 step tablets, made by Eastman Kodak Co. were exposed to the light. Then, the development was carried out in the same manner as in Example 7. Step number was 4.

EXAMPLE 11

(Color filter)

At first, a dispersion (II) was prepared by dispersing polymer A, pigments and a dispersing agent (A-600, trademark of a product made by Daiichi Kogyo Seiyaku K.K.) in a bead mill for 3 hours for green picture cells of a color filter among the three primary colors, i.e. blue, green and red. The pigments for this purpose were C.I. pigment Green 36 and C.I. Pigment Yellow 139 in a ratio of the former to the latter of 72:28. As the solvent γ-butyrolactone was likewise used. 2.5% of the dispersing agent A-600 was used on the basis of the dispersion as in Example 7. Average particle size was measured by particle analyzer Horiba-CAPA-700 and found to be 0.3 μm. The thus obtained dispersion (II) was mixed with a photosensitive solution for color filter with a stirrer. Photosensitive solution formulation for color filter is given in the following Table 8.

TABLE 8

| Resin (a') | |
|---|---|
| Polymer A | 78 parts |
| Monomer (c) | |
| Trimethylolpropane Triacrylate | 30 parts |
| Photo-initiator (d) | |
| Benzophenone | 8 parts |
| Benzoin ethyl ether | 8 parts |
| Sensitizer (e) | |
| 2-mercapto-benzoimidazole* | 1.5 parts |
| Solvent | |
| N-methylpyrrolidone | 5 parts |
| γ-butyrolactone | 500 parts |
| Polymerization inhibitor | |
| p-methoxyphenol | 0.1 part |
| Surfactant | |
| Perfluoroalkyl alkoxylate | 0.01 part |
| Dispersion [II] | |
| Including a coloring agent (b) | 48 parts |

Note)
*Including the tautomer.

Viscosity as measured was 44 m·Pa·S. A color filter was prepared through an application step at 1,200 rpm, a drying step to a film thickness of 2.0 μm, a light exposing step at 130 mJ/cm² and a developing step for a developing time of 70 seconds in the same manner as in Example 7. Optical sensitivity was step No. 8 in the Kodak Step Tablets.

EXAMPLE 12

(Color filter)

A color filter was prepared with the dispersion (II) of Example 11 according to photosensitive solution formulation for color filter given in the following Table 9.

TABLE 9

| Resin (a') | |
|---|---|
| Polymer A | 75 parts |
| Monomer (c) | |
| Trimethylolpropane triacrylate | 30 parts |
| Photo-initiator (d) | |
| Benzophenone | 8 parts |
| Benzoin ethyl ether | 8 parts |
| Sensitizer (e) | |
| 2-mercapto-benzoimidazole* | 4.5 parts |

TABLE 9-continued

| Solvent | |
|---|---|
| N-methylpyrrolidone | 5 parts |
| γ-butyrolactone | 500 parts |
| Polymerization inhibitor | |
| p-methoxyphenol | 0.1 part |
| Dispersion [II] | |
| Including a coloring agent (b). | 48 parts |

Note)
*Including the tautomer.

A color filter was prepared through an application step at 1,200 rpm, a drying step to a film thickness of 2.0 μm at 80° C. for 1 minutes, a light exposure step at 130 mJ/cm² and a developing step for a developing time of 70 seconds in the same manner as in Example 7. Optical sensitivity as measured was Step No. 7.5 in the Kodak Step Tablets. picture cells of color mosaic pattern were excellent.

EXAMPLE 13

(Color filter)

A color filter was prepared with the dispersion (II) of Example 11 according to photosensitive solution formulation for color filter given in the following Table 10.

TABLE 10

| Resin (a') | |
|---|---|
| Polymer A | 75 parts |
| Monomer (c) | |
| Trimethylolpropane triacrylate | 30 parts |
| Photo-initiator (d) | |
| Benzophenone | 8 parts |
| Benzoin ethyl ether | 8 parts |
| Sensitizer (e) | |
| 2-mercapto-benzoimidazole* | 4.5 parts |
| Solvent | |
| N-methylpyrrolidone | 5 parts |
| γ-butyrolactone | 500 parts |
| Polymerization inhibitor | |
| p-methoxyphenol | 0.1 part |
| Dispersion [II] | |
| Including a coloring agent (b). | 48 parts |

Note)
*Including the tautomer.

Viscosity as measured was 44 m·Pa·S. A color filter of mosaic pattern was formed through an applications step at 1,200 rpm, a drying step to a film thickness of 2.8 μm at 80° C. for 10 minutes and a light exposure step at 130 mJ/cm² and a developing step for a developing time of 70 seconds in the same manner as in Example 7. Optical sensitivity was measured was Step No. 6.5 in the Kodak Step Tablets. Picture cells of color mosaic pattern were excellent.

EXAMPLE 14

(Color filter)

A pattern for a color filter was formed with the dispersion (II) of Example 11 through an application step at 1,200 rpm, a drying step to a film thickness of 2.0 μm at 80° C. for 10 minutes, a light exposure step at 130 mJ/cm² and a developing step for a developing time of 70 seconds according to photosensitive solution formulation for color filter given in the following Table 11 in the same manner as in Example 7 except that 2-mercaptobenzoimidazole was excluded. Optical sensitivity as measured was Step No. 5 in the Kodak Step Tablets.

TABLE 11

| Resin (a') | |
|---|---|
| Polymer A | 79.5 parts |
| Monomer (c) | |
| Trimethylolpropane triacrylate | 30 parts |
| Photo-initiator (d) | |
| Benzophenone | 8 parts |
| Benzoin ethyl ether | 8 parts |
| Solvent | |
| N-methylpyrrolidone | 5 parts |
| γ-butyrolactone | 500 parts |
| Polymerization inhibitor | |
| p-methoxyphenol | 0.1 part |
| Dispersion [II] | |
| Including a coloring agent (b). | 48 parts |

EXAMPLE 15

(Color filter)

At first, a dispersion (III) was prepared by dispersing polymer A, pigments and a dispersing agent (A-600, trademark of a product made by Daiichi Kogyo Seiyaku K.K.) into a solvent in a bead mill for 3 hours for red picture cells of a color filter among the three primary colors, i.e. blue, green and red. The pigments for this purpose was C.I. Pigment Red 177 and C.I. Pigment Yellow 139 in a ratio of the former to the latter of 85:15. As the solvent, γ-butyrolactone was likewise used.

The composition of the dispersion (III) was 37.5% resin, 15% pigments (C.I. Pigment Red 177 and C.I. Pigment Yellow 139), and 50% solvent, as in Example 7. 2.5% of the dispersing agent (A-600) was used on the basis of the dispersion (III). Average particle size was likewise measured and found to be 0.3 μm. The thus obtained dispersion was mixed with a photosensitive solution for color filter according to a photosensitive solution formulation for color filter given in the following Table 12.

TABLE 12

| Resin (a') | |
|---|---|
| Polymer A | 78 parts |
| Monomer (c) | |
| Trimethylolpropane triacrylate | 30 parts |

TABLE 12-continued

| | | |
|---|---|---|
| Photo-initiator (d) | | |
| Benzophenone | 8 | parts |
| Benzoin ethyl ether | 8 | parts |
| Sensitizer (e) | | |
| 2-mercapto-benzoimidazole* | 1.5 | parts |
| Solvent | | |
| N-methylpyrrolidone | 5 | parts |
| γ-butyrolactone | 500 | parts |
| Polymerization inhibitor | | |
| p-methoxyphenol | 0.1 | part |
| Surfactant | | |
| Perfluoroalkyl alkoxylate | 0.01 | part |
| Dispersion [III] | | |
| Including a coloring agent (b) | 48 | parts |

Note)
*Including the tautomer.

Viscosity as measured was 44.0 m·Pa·S. Color filter pattern was formed through an application step at 1,200 rpm, a drying step to a film thickness of 2.0 μm at 80° C. for 10 minutes, a light exposure step at 130 mJ/cm² and a developing step for a developing time of 70 seconds in the same manner as in Example 7. Optical sensitivity was Step No. 7 in the Kodak Step Tablets.

EXAMPLE 16

(Color filter)

The dispersion was likewise mixed with a photosensitive solution for color filter with a stirrer according to photosensitive solution formulation for color filter given in the following Table 13.

TABLE 13

| | | |
|---|---|---|
| Resin (a') | | |
| Polymer A | 75 | parts |
| Monomer (c) | | |
| Trimethylolpropane triacrylate | 30 | parts |
| Photo-initiator (d) | | |
| Benzophenone | 8 | parts |
| Benzoin ethyl ether | 8 | parts |
| Sensitizer (e) | | |
| 2-mercapto-benzoimidazole* | 4.5 | parts |
| Solvent | | |
| N-methylpyrrolidone | 5 | parts |
| γ-butyrolactone | 500 | parts |
| Polymerization inhibitor | | |
| p-methoxyphenol | 0.1 | part |

TABLE 13-continued

| | | |
|---|---|---|
| Dispersion [III] | | |
| Including a coloring agent (b). | 48 | parts |

Note)
*Including the tautomer.

Viscosity as measured was 44.0 m·Pa·S. Color filter pattern was formed through an application step at 1,300 rpm, a drying step to a film thickness of 2.0 μm at 80° C. for 10 minutes, a light exposure step at 130 mJ/cm² and a developing step for a developing time of 70 seconds in the same manner as in Example 7. Optical sensitivity was Step No. 8 in the Kodak Step Tablets.

EXAMPLE 17

(Color filter)

A color filter pattern was likewise formed with the dispersion (III) and the photosensitive solution for color filter through an application step at 1,300 rpm, a drying step to a film thickness of 2.0 μm at 80° C. for 10 minutes, a light exposure step at 130 mJ/cm² and a developing step for a developing time of 70 seconds in the same manner as in Example 16 except that 2-mercaptobenzoimidazole was excluded. Optical sensitivity was Step No. 5 in the Kodak Step Tablets.

Color proof

At first, dispersions (IV) were each prepared by mixing polymer A, one of pigments and a dispersing agent (A-600) into a solvent in a bead mill for 3 hours. As the color pigments, carbon black was used for black; or C.I. Pigment 15:3 was used for Cyan; or C.I. Pigment Red 57:3 was used for Magenta; or C.I. Pigment Yellow 12 was used for Yellow. In preparation of the dispersions (IV) each, 2.5% of the dispersing agent was used on the basis of each dispersion (IV). The composition of each dispersion (IV) was 37.5% resin, 12.5% of one of pigments and 50% diglyme as the solvent. Photosensitive solution formulation for color filter used for the color proof is given in the following Table 14.

TABLE 14

| | | |
|---|---|---|
| Resin (a') | | |
| Polymer A | 80 | parts |
| Monomer (c) | | |
| Trimethylolpropane triacrylate | 30 | parts |
| Photo-initiator (d) | | |
| Benzophenone | 8 | parts |
| Benzoin ethyl ether | 8 | parts |
| Solvent | | |
| Diglyme | 500 | parts |
| Sensitizer (e) | | |
| 2-mercapto-benzoimidazole* | 4.0 | parts |
| Polymerization inhibitor | | |
| p-methoxyphenol | 0.1 | part |

TABLE 14-continued

| | Dispersion [III] | |
|---|---|---|
| | Including a coloring agent (b) | 48 parts |

Note)
*Including the tautomer.

These four coloring photosensitive solutions were each applied to respective polyethylene terephthalate film supports having a thickness of 75 μm each to a film thickness of 2 μm by a wire bar, followed by drying. The polyethylene terephthalate film supports were each provided with a coat film having a thickness of 1 μm made from 100 parts of ionomer resin (solid content: 27 wt. %) and 100 parts of polypropylene emulsion (solid content: 30 wt. %, made by Toho Kagaku Kogyo K.K.) on the respective surfaces in advance. Four colored images were formed on the respective polyethylene terephthalate films by laying a positive films of chromalytic net for respective colors on the respective polyethylene terephthalate film surfaces, on which the colored photosensitive layers of Cyan, Magenta, Yellow and Black were formed from these colored photosensitive solutions, respectively, each followed by light exposure at a distance 80 cm from a 2 kW metal halide lamp for 30 seconds and by development in the same manner as in Example 7.

Then, on art paper was tightly laid on the black-colored image picture and the thus obtained set of the art paper and the black-colored image picture was passed through between a pair of hip rolls heated at 85° C. under pressing at 4.5 kg/cm² at a speed of 50 cm/minute, and then the support film was removed therefrom, whereby only the black image was transferred to the art paper, likewise, other colored images were successively transferred to the art paper in the order of the Cyan-colored image, the Magenta-colored image and the Yellow-colored image to obtain a color proofing images on the art paper. Colored image finish on the art paper showed that of substantially actual printed image and thus was capable of thoroughly serving as a color proof.

Examples 7 to 17 using the compounds (II) and (III) are summarized in the following Table 15, where the step number is based on the Kodak Step Tablets.

TABLE 15

| Example No. | Sensitizer | Picture cell | Amount of sensitizer used (parts) | Step number |
|---|---|---|---|---|
| Ex. 7 | 2MBI*¹ | Blue | 1.5 | 7 |
| Ex. 8 | 2MBI*¹ | Blue | 4.5 | 8 |
| Ex. 9 | 2MBT*² | Blue | 4.5 | 6 |
| Ex. 10 | — | Blue | 0 | 4 |
| Ex. 11 | 2MBI*¹ | Green | 1.5 | 8 |
| Ex. 12 | 2MBI*¹ | Green | 4.5 | 7.5 |
| Ex. 13 | 2MBT*² | Green | 4.5 | 6.5 |
| Ex. 14 | — | Green | 0 | 5 |
| Ex. 15 | 2MBI*¹ | Red | 1.5 | 7 |
| Ex. 16 | 2MBI*¹ | Red | 4.5 | 8 |
| Ex. 17 | — | Red | 0 | 5 |

*¹2MBI: 2-mercaptobenboimidazole
*²2MBT: 2-mercaptobenzothiazole

The compounds (II) and (III) have a sensitizer effect on any one of blue, green and red photosensitive solutions, as compared with those containing no such compounds. However, it is possible to use the materials described in Examples 10, 14 and 17, if the exposure time is extended or the strength of the light is increased.

The effects of the present invention can be summarized as follows:

(1) photosensitivity can be increased by addition of these compounds (II) and (III).

(2) Even a pigment dispersion is stable for a long time without any occurrence of secondary coagulation.

What is claimed is:

1. A photosensitive solution, which comprises a colored image forming material including
   (a) 10 to 85% by weight of a resin having an acid value of 20 to 300 and an unsaturation equivalent weight of 200 to 3,000 represented by the following formula (I):

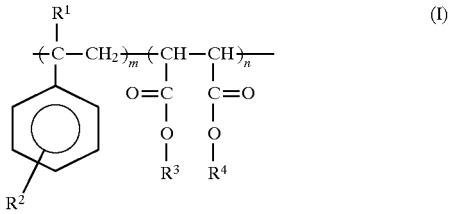

wherein $R^1$ is a hydrogen atom or a methyl group; $R^2$ is a hydrogen atom, a hydroxyl group or an alkyl group or an alkoxy group having 1 to 12 carbon atoms; $R^3$ and $R^4$ are independently at least one of a hydrogen atom, an alkyl group having 1 to 12 carbon atoms and a group having a photopolymerizable unsaturated bond, which may have one hydroxyl group, with the proviso that at least some of the groups represented by $R^3$ and $R^4$ are hydrogen to provide the needed acid value and at least some of these groups are the group having a photopolymerizable unsaturated bond to provide the needed unsaturation equivalent weight; and m and n are independently an integer of 1 or more and are so selected as to satisfy a relationship of $m \geq n$,
   (b) 5 to 50% by weight of a coloring agent,
   (c) 2 to 50% by weight of a monomer having at least one photopolymerizable unsaturated bond in the molecule, and
   (d) 0.01 to 20% by weight of a photoinitiator, a total amount of the components (a), (b), (c) and (d) being 100% by weight, and
   an organic solvent in an amount for making a total solid content of the components (a), (b), (c) and (d) in the solution 5–40% by weight.

2. A photosensitive solution according to claim 1, wherein said organic solvent is selected from a group consisting of mono- or di-alkyl ether of diethylene glycol, mono- or di-alkyl ether of propylene glycol, mono- or di-alkyl ether of dipropylene glycol, mono- or di-alkyl ether of tripropylene glycol, an acetylated product of diethylene glycol monoalkyl ether and lactone.

3. A photosensitive solution according to claim 1, wherein the coloring agent (b) is a pigment.

4. A photosensitive solution according to claim 1, wherein the organic solvent is at least one member selected from the group consisting of ketones, glycols, alcohols, aromatic compounds, lactic acid esters, and lactones.

5. A photosensitive solution according to claim 1, wherein at least one of $R^3$ and $R^4$ in the formula (I) is an alkyl group having 1 to 12 carbon atoms.

6. A photosensitive solution according to claim 1, wherein $R^3$ in the formula (I) is an alkyl group having 1 to 6 carbon atoms.

7. A photosensitive solution according to claim 1, wherein in the formula (I) $R^3$ is an alkyl group having 1 to 12 carbon atoms, and m and n are selected so as to satisfy a relationship of $1 \leq m/n \leq 5$.

8. A photosensitive solution according to claim 1, wherein said resin has an unsaturation equivalent weight of 600 to 3,000.

9. A photosensitive solution according to claim 1, wherein said resin has an acid value of 60 to 150.

10. A colored image forming material, which comprises:
(a) 10 to 85% by weight of a resin having an acid value of 20 to 300 and an unsaturation equivalent weight of 200 to 3,000 represented by the following formula (I):

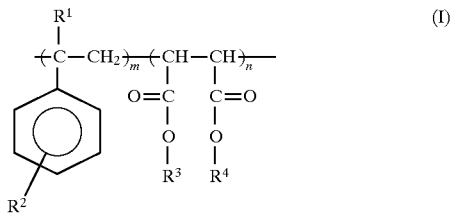

wherein $R^1$ is a hydrogen atom or a methyl group; $R^2$ is a hydrogen atom, a hydroxyl group or an alkyl group or an alkoxy group having 1 to 12 carbon atoms; $R^3$ and $R^4$ are independently at least one of a hydrogen atom, an alkyl group having 1 to 12 carbon atoms and a group having a photopolymerizable unsaturated bond, which may have one hydroxyl group, with the proviso that at least some of the groups represented by $R^3$ and $R^4$ are hydrogen to provide the needed acid value and at least some of these groups are the group having a photopolymerizable unsaturated bond to provide the needed unsaturation equivalent weight; and m and n are independently an integer of 1 or more and are so selected as to satisfy a relationship of $m \geq n$,
(b) 5 to 50% by weight of a coloring agent,
(c) 2 to 50% by weight of a monomer having at least one photopolymerizable unsaturated bond in the molecule, and
(d) 0.01 to 20% by weight of a photoinitiator, a total amount of the components (a), (b), (c) and (d) being 100% by weight.

11. A photosensitive element, which comprises a support and a layer containing a colored image forming material according to claim 10 on the support.

12. A photosensitive element according to claim 8, wherein a peelable cover film is laid on the layer containing a colored image forming material by lamination.

13. A photosensitive element according to claim 11, wherein said layer containing the colored image forming material has a thickness of 0.1 to 300 μm.

14. A photosensitive element according to claim 13, wherein said layer containing the colored image forming layer has a thickness of 0.2 to 5 μm.

15. A process for producing a color filter, which comprises forming a film of a colored image forming material according to claim 10 on a substrate, exposing the film to actinic light imagewise, thereby photocuring the desired portions of the film, and removing the unexposed portions from the film by development.

16. A process for producing a color filter according to claim 15, which further comprises repeating the steps for individual different color image forming materials, respectively, thereby forming a plurality of different colored picture cells.

17. A process according to claim 16, wherein the different colored picture cells are red, green and blue picture cells.

18. A color filter produced according to the process of claim 17.

19. A color filter produced according to the process of claim 15.

20. A colored image forming material according to claim 10, wherein $R^3$ is an alkyl group having 1 to 12 carbon atoms; $R^4$ is a hydrogen atom, an alkyl group having 1 to 12 carbon atoms or a group having a photopolymerizable unsaturated bond, which optionally has one hydroxyl group; and m and n are selected to satisfy a relationship of $1 \leq m/n \leq 5$.

21. A colored image forming material according to claim 10, wherein said coloring agent is included in an amount of 10%–40% by weight.

22. A colored image forming material according to claim 21, wherein said amount of coloring agent included in the material is 15% to 30% by weight.

* * * * *